United States Patent
Deaton et al.

(10) Patent No.: US 11,138,355 B1
(45) Date of Patent: Oct. 5, 2021

(54) UNREACHABLE COVER ROOT CAUSE SEARCH

(71) Applicant: Cadence Design Systems, Inc., San Jose, CA (US)

(72) Inventors: Craig Franklin Deaton, Rowlett, TX (US); Maayan Ziv, Haifa (IL); Kanwar Pal Singh, Noida (IN); Nizar Hanna, Karmiel (IL); Gasob Mazzawi, Nazareth (IL)

(73) Assignee: CADENCE DESIGN SYSTEMS, INC., San Jose, CA (US)

(*) Notice: Subject to any disclaimer, the term of this patent is extended or adjusted under 35 U.S.C. 154(b) by 0 days.

(21) Appl. No.: 17/099,301

(22) Filed: Nov. 16, 2020

(51) Int. Cl.
*G06F 30/327* (2020.01)
*G06F 30/394* (2020.01)
*G06F 30/398* (2020.01)
*G06F 30/333* (2020.01)
*G06F 30/3323* (2020.01)
*G06F 30/3308* (2020.01)

(52) U.S. Cl.
CPC .......... *G06F 30/327* (2020.01); *G06F 30/333* (2020.01); *G06F 30/3323* (2020.01); *G06F 30/394* (2020.01); *G06F 30/398* (2020.01); *G06F 30/3308* (2020.01)

(58) Field of Classification Search
CPC ............... G06F 30/333; G06F 30/3308; G06F 30/3323; G06F 30/327; G06F 30/398; G06F 30/394
USPC ............................ 716/106, 111, 136; 703/16
See application file for complete search history.

(56) References Cited

U.S. PATENT DOCUMENTS

| 5,748,487 A * | 5/1998 | Sawasaki ................. G06F 7/00 716/103 |
| 6,618,841 B1 * | 9/2003 | Huang ................. G06F 30/3323 716/103 |
| 8,104,001 B2 | 1/2012 | Lehavot et al. |
| 8,225,249 B1 * | 7/2012 | Martensson ........ G06F 30/3323 716/106 |
| 8,350,594 B2 * | 1/2013 | Karczmarek ........... G06F 30/35 326/93 |
| 8,910,099 B1 | 12/2014 | Goyal et al. |
| 9,922,209 B1 | 3/2018 | Purri et al. |
| 10,108,767 B1 | 10/2018 | Purri et al. |
| 10,289,798 B1 | 5/2019 | Nunes Barcelos et al. |
| 10,515,169 B1 | 12/2019 | Spatafore et al. |
| 10,546,083 B1 | 1/2020 | Verma et al. |
| 10,706,195 B1 | 7/2020 | Rezende Barbosa et al. |

(Continued)

*Primary Examiner* — Phallaka Kik
(74) *Attorney, Agent, or Firm* — Tarolli, Sundheim, Covell & Tummino LLP

(57) ABSTRACT

A formal verification EDA application can be configured to receive a circuit design of an IC chip, the circuit design of the IC chip including a list of properties for the IC chip. The list of properties includes a list of covers for the IC chip. The formal verification engine can also execute a formal verification of the IC chip. Results of the formal verification identifies a subset of covers of the list of covers that are unreachable. The formal verification engine can further execute a root cause search for a selected cover in the subset of covers that are unreachable. The root cause search selectively adds and removes cutpoints to signals in the circuit design to identify a root cause for the selected cover being unreachable. The root cause comprises a signal in the circuit design that is upstream from the selected cover.

20 Claims, 18 Drawing Sheets

(56) References Cited

U.S. PATENT DOCUMENTS

| | | | |
|---|---|---|---|
| 10,984,159 B1* | 4/2021 | Nevo | G06F 11/3676 |
| 2002/0108093 A1* | 8/2002 | Moondanos | G06F 30/3323 |
| | | | 716/107 |
| 2003/0131324 A1* | 7/2003 | Takenaka | G06F 30/3323 |
| | | | 716/103 |
| 2006/0085774 A1* | 4/2006 | Moorby | G06F 30/33 |
| | | | 716/106 |
| 2008/0109773 A1* | 5/2008 | Douriet | G06F 30/367 |
| | | | 716/115 |
| 2009/0144683 A1 | 6/2009 | Lehavot et al. | |
| 2015/0169301 A1* | 6/2015 | Imai | G06F 11/3604 |
| | | | 717/140 |
| 2019/0147121 A1 | 5/2019 | Chen et al. | |

\* cited by examiner

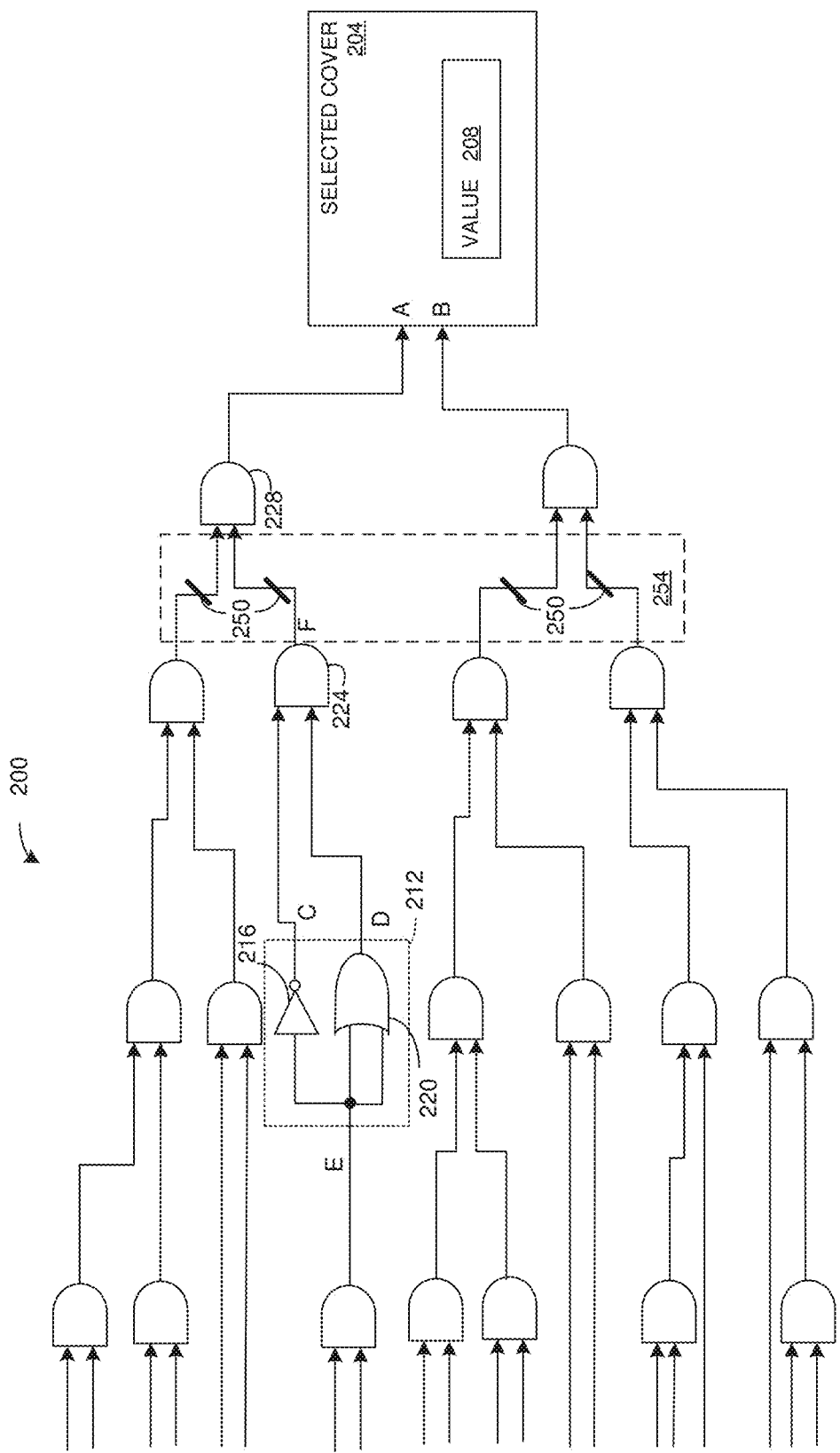

UNREACHABLE COVER ROOT CAUSE SEARCH

TECHNICAL FIELD

This disclosure relates to electronic design automation (EDA) applications. More particularly, this disclosure relates to a formal verification EDA application identifying a root cause of an unreachable cover.

BACKGROUND

A hardware description language (HDL) is a specialized computer language used to describe the structure and behavior of electronic circuits, and most commonly, digital logic circuits. HDL enables a precise, formal description of an electronic circuit that allows for the automated analysis and simulation of an electronic circuit. It also allows for the synthesis of an HDL description into a netlist (a specification of physical electronic components and how they are connected together), which can then be placed and routed to produce the set of masks used to create an integrated circuit.

EDA, also referred to as electronic computer-aided design (ECAD), is a category of software applications for designing electronic systems such as integrated circuits and printed circuit boards. The applications work together in a design flow that chip designers use to design and analyze entire semiconductor chips. Since modern semiconductor chips can have billions of components, EDA applications are essential for their design. As one example, EDA applications can include logic synthesis, logic simulation and formal verification.

Logic synthesis is a process by which an abstract specification of desired circuit behavior, typically at the register-transfer level (RTL), is turned into a design implementation in terms of logic gates, typically by a computer application called a synthesis tool (a particular EDA application). Common examples of this process include synthesis of designs specified in hardware description languages, including VHDL and Verilog. Some synthesis tools generate bitstreams for programmable logic devices such as application array logic (PAL) devices or field programmable gate arrays (FPGAs), while others target the creation of application specific integrated circuits (ASICs).

Formal verification is the use of formal verification software (another EDA application) to execute the task of verifying that the logic design conforms to specification. This is a complex task, and takes the majority of time and effort in most large electronic system design projects. Most formal verifications are executed on the gate level of a circuit.

SUMMARY

One example relates to a non-transitory machine-readable medium having machine-readable instructions, the machine-readable instructions including a formal verification EDA application. The formal verification EDA application can be configured to receive a circuit design of an integrated circuit (IC) chip. The circuit design of the IC chip includes a list of properties for the IC chip. The list of properties includes a list of covers for the IC chip. The formal verification engine can also execute a formal verification of the IC chip, wherein results of the formal verification identifies a subset of covers of the list of covers that are unreachable. The formal verification engine can further execute a root cause search for a selected cover in the subset of covers that are unreachable. The root cause search selectively adds and removes cutpoints to signals in the circuit design to identify a root cause for the selected cover being unreachable. The root cause includes a signal in the circuit design that is upstream from the selected cover.

Another example relates to a method for determining a root cause of an unreachable cover. The method can include receiving, by a formal verification EDA application, a circuit design of an IC chip. The circuit design of the IC chip includes a list of properties for the IC chip, wherein the list of properties includes a list of covers for the IC chip. The method can also include executing, by the formal verification EDA application, a formal verification of the IC chip, wherein results of the formal verification identify a subset of covers of the list of covers that are unreachable. The method can further include identifying, by the formal verification EDA application, a sufficient set of cutpoint signals, that if cutpoints are applied thereon, make a selected cover of the subset of covers reachable. The method can yet further include selecting, by the formal verification EDA application, a set of key cutpoint signals from the sufficient set of cutpoint signals to determine a root cause of the selected cover being unreachable.

Yet another example relates to a system including a non-transitory memory to store machine-readable instructions and a processor to access the memory and execute the machine-readable instructions. The machine-readable instructions include a formal verification EDA application. The formal verification EDA application can be configured to receive a circuit design of an IC chip. The circuit design of the IC chip includes a list of properties for the IC chip. The list of properties can include a list of covers for the IC chip. The formal verification EDA application can execute a formal verification of the IC chip, wherein results of the formal verification identify a subset of covers of the list of covers that are unreachable. The formal verification EDA application can also execute a root cause search for a selected cover in the subset of covers that are unreachable. The root cause search selectively adds and removes cutpoints to signals in the circuit design to identify a root cause for the selected cover being unreachable. The root cause can include a signal in the circuit design that is upstream from the selected cover.

BRIEF DESCRIPTION OF THE DRAWINGS

FIGS. 2A-2K illustrate a diagram of a module of a circuit with cutpoints selectively added and removed.

DETAILED DESCRIPTION

This disclosure relates to systems and methods for executing a formal verification of a design on an IC chip. The formal verification can be executed by a formal verification EDA application. The circuit design of the IC chip can include a list of properties for the IC chip, and the list of properties comprises a list of covers for the IC chip. Results of the formal verification can include data identifying a subset of covers of the list of covers that are unreachable.

A cover is a logical statement for the circuit design wherein there should be at least one set of conditions (signal values) that cause the cover to resolve to true. An unreachable cover is a cover for which there is no known set of conditions that would make the cover true (reachable). Upon identifying an unreachable cover, an unreachable cover engine of the formal verification engine can execute a root cause search to identify a signal (trace) that is preventing the unreachable cover from resolving to true.

To execute the root cause search, the unreachable cover engine can identify a sufficient set of signals of the circuit design, that if cutpoints are applied thereon, make the unreachable cover reachable (resolve to true), which set of signals are referred to as a sufficient set of cutpoint signals. A cutpoint or (stopat, in some examples), is an HDL command that allows one or more signals in a logical statement to be manually or automatically assigned a value. Accordingly, if a given signal has a cutpoint injected thereon, the given signal's value is decided by an assignment of the value rather than by logical analysis. Thus, the sufficient set of cutpoint signals are a set of signals in the circuit design that can be set to values which can cause the unreachable cover to resolve to true, thereby making the unreachable cover reachable.

Additionally, to execute the root cause search, the unreachable cover engine can select a set of key cutpoint signals from the sufficient set of cutpoint signals to determine the root cause of the unreachable cover. That is, the unreachable cover engine can refine the sufficient set of cutpoint signals to identify the signal (or multiple signals) that are preventing the unreachable cover from being reachable. To select the set of key cutpoint signals, the unreachable cover engine can selectively remove subsets of cutpoint signals to determine the impact of each such subset on the reachability of the selected cover to reveal the key cutpoint signal. This key cutpoint signal can be the root cause of the unreachable cover. Thus, the EDA application can output data characterizing the root cause of the unreachable cover in a GUI.

Figure 1:
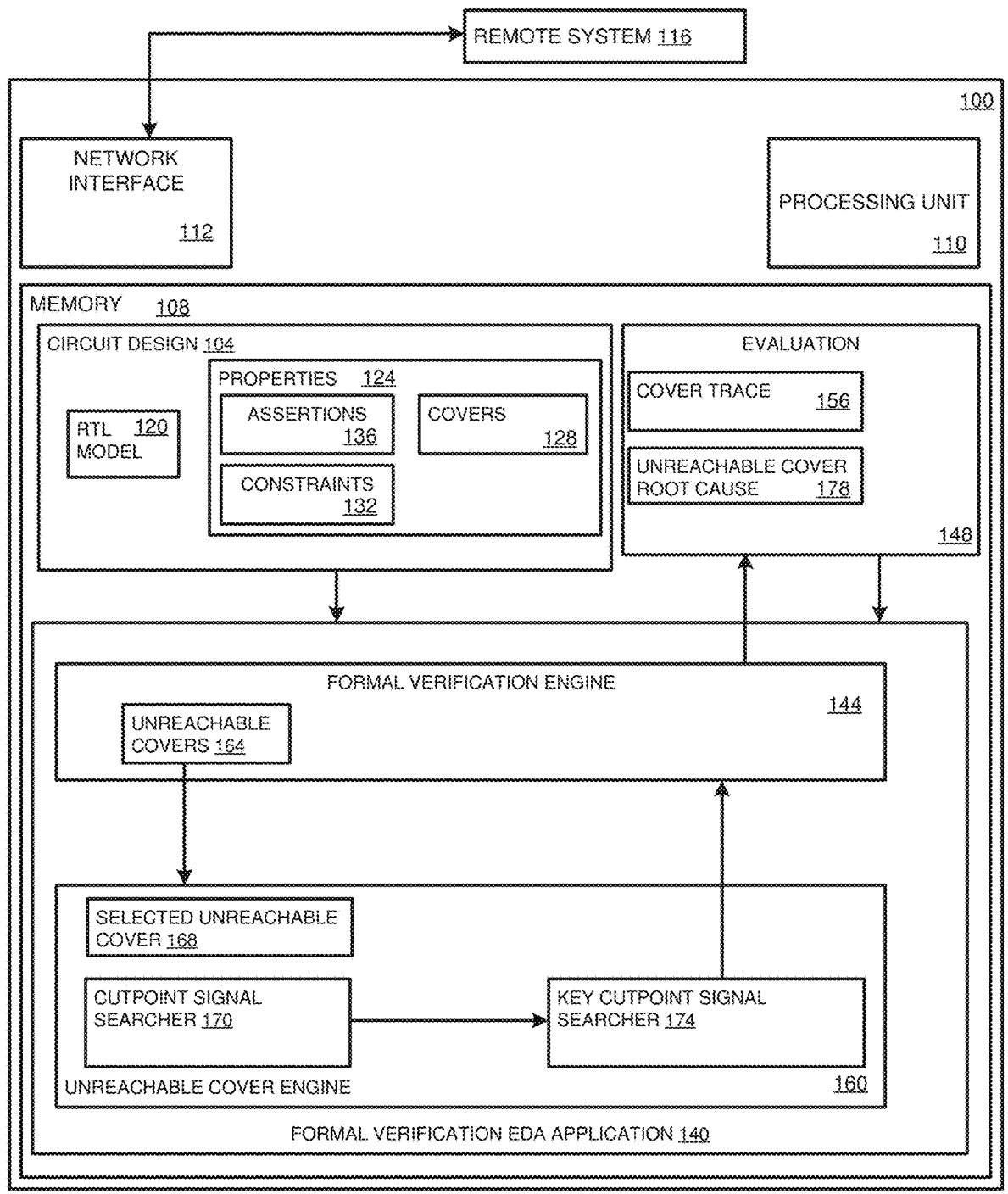
FIG. 1 illustrates an example of a system for executing a formal verification of a circuit design with unreachable covers.

FIG. 1 illustrates an example of a system 100 for executing a formal verification of a circuit design 104 to determine a root cause of unreachable covers. The system 100 can represent a computing platform. Accordingly, the system 100 can include a memory 108 for storing machined readable instructions and data and a processing unit 110 for accessing the memory 108 and executing the machine-readable instructions. The memory 108 represents a non-transitory machine-readable memory, such as random access memory (RAM), a solid state drive, a hard disk drive or a combination thereof. The processing unit 110 can be implemented as one or more processor cores. The system 100 can include a network interface 112 (e.g., a network interface card) configured to communicate with other computing platforms via a network, such as a public network (e.g., the Internet), a private network (e.g., a local area network) or a combination thereof (e.g., a virtual private network).

The system 100 could be implemented in a computing cloud. In such a situation, features of the computing platform, such as the processing unit 110, the network interface 112, and the memory 108 could be representative of a single instance of hardware or multiple instances of hardware with applications executing across the multiple of instances (i.e., distributed) of hardware (e.g., computers, routers, memory, processors, or a combination thereof). Alternatively, the system 100 could be implemented on a single dedicated server or workstation.

The circuit design 104 can be stored in the memory 108. The circuit design 104 can be implemented, for example, as design specifications for an IC chip. The circuit design 104 can be generated with an EDA application, such as a logic synthesis application (e.g., a synthesis tool). In such a situation, an end-user (e.g., a circuit designer) of a remote system 116 can employ a user-interface to generate and/or modify HDL code (e.g., Verilog) for generating an RTL model 120 (e.g., RTL code) characterizing a circuit, wherein the RTL model 120 is transformable by an EDA application into a physically realizable gate-level netlist for the circuit design 104.

Additionally, the circuit design 104 includes a set of properties 124 that define a list of covers 128, constraints 132 and assertions 136 for the circuit design 104. Moreover, in examples where the circuit design 104 was generated with Verilog, the properties 124 may be referred to as System-Verilog Assertions (SVAs). The covers 128 (alternatively referred to as a cover property) define states for the circuit design 104 that must be able to occur under certain conditions. Stated differently, each of the covers 128 represents a logical value driven by a set of inputs. In order for a fabricated circuit based on the circuit design 104 to operate correctly, there must be a set of inputs that result in each respective logical value corresponding to the covers 128 to be true (logical 1). If there are not a set of inputs under which the logical value for a given cover 128 resolves to true (logical 1), the circuit design 104 has design errors (e.g., bugs).

The assertions 136 of the properties 124 define states for the circuit design 104, which if occur on a fabricated IC chip for the circuit design 104 would indicate that the circuit design has design errors (e.g., bugs). Stated differently, each of the assertions 136 represent a logical value driven by a set of inputs that should always be true. If there is a set of the inputs that results in the logical value of an assertion being false (e.g., logical 0), the circuit design 104 has design errors (e.g., bugs). The constraints 132 (alternatively referred to as assumptions) of the properties 124 define rules, such as input states for the RTL model 120 for operating the IC chip characterized by the circuit design 104. Such constraints 132, if violated, would cause errors in a fabricated IC chip corresponding to the circuit design 104, wherein simulation and/or formal verification of such violations of the constraints 132 need not be evaluated. Stated differently, constraints 132 define illegal (unpermitted) states of the IC chip corresponding to the circuit design 104.

As one example, the system 100 receives the circuit design 104 that includes the RTL model 120 and the properties 124 via the network interface 112. The system 100 stores the circuit design 104 in the memory 108.

Before fabrication of an IC chip corresponding to the circuit design 104, the circuit design 104 is subjected to formal verification. Formal verification refers to the process of establishing functional correctness between the RTL model 120 and the properties 124 without running simulations. More specifically, formal verification is an exhaustive mathematical analysis to prove or disprove the correctness of a circuit design with respect to a set of covers 128 and assertions 136 specifying intended design behavior. In chip hardware design, formal verification is a systematic process to verify that the design intent is preserved in the implementation (the RTL model 120).

Given the huge number of states in even a small design, it is impractical to simulate more than a miniscule percentage of design behavior. Moreover, the simulation is probabilistic and the chances of exercising every scenario that would reveal a design bug are relatively small. Corner-case bugs, namely bugs that require very specific conditions to be triggered, are often missed in simulation. Formal verification statically analyzes the circuit design 104 for all possible input sequences (or some subset thereof) and all possible state values (or some subset thereof), checking to see if the covers 128 can be satisfied and if the assertions 136 can be violated. These violations of assertions 136 are referred to as "counter-examples" since each represents a way in which the implementation does not match the specification of intended behavior.

The memory 108 includes a formal verification EDA application 140 that can be employed to execute a formal verification of the circuit design 104. More particularly, the formal verification EDA application 140 includes a formal verification engine 144 that can generate and output an evaluation 148 of the circuit design 104. Data characterizing the evaluation 148 can be output to an end-user via a display, such as a remote display operating on the remote system 116. In some examples, the evaluation 148 is generated by the formal verification engine 144 through execution of a formal verification of the circuit design 104.

Additionally, in some examples, the evaluation 148 generates a cover trace 156 (or multiple cover traces) for each cover 128 that is reachable. As used herein, the term "reachable" indicates that there are a set of signals (or multiple sets of signals) that cause a value of a particular cover to resolve to true (logical 1). Conversely, a given cover that is determined to be "unreachable" indicates that there is no set of signals that will result in a value associated with the given cover to be true. Each unreachable cover of the covers 128 indicates that there is potentially a bug in the circuit design 104, since there is no set of signals that make an unreachable cover true.

To assist a designer with debugging, formal verification EDA application 140 includes an unreachable cover engine 160. The formal verification engine 144 can generate a list of unreachable covers 164. The formal verification engine 144 can select an unreachable cover 168 of the list of unreachable covers 164 and provide the selected unreachable cover 168 to an unreachable cover engine 160. In some examples, the selected unreachable cover 168 can be chosen in response to user input (e.g., via a GUI). In other examples, the formal verification engine 144 can choose the selected unreachable cover 168 automatically.

In response, the unreachable cover engine 160 can provide the selected unreachable cover 168 to a cutpoint signal searcher 170 that can identify a set of signals sufficient to make the selected unreachable cover reachable if cutpoints are applied (injected) on to each of the set of signals, which is referred to as a sufficient set of cutpoint signals. The sufficient set of cutpoint signals can be provided to a key cutpoint signal searcher 174 that can refine the sufficient set of cutpoint signals for the selected unreachable cover 168 to determine a key cutpoint signal (or multiple key cutpoint signals) that corresponds to a root cause (or multiple root causes) for the selected unreachable cover 168.

Operation of the cutpoint signal searcher 170 and the key cutpoint signal searcher 174 are better understood with a detailed example. FIGS. 2A-2K illustrate an example of a module 200 in a circuit design that can be employed as a module of the circuit design 104 of FIG. 1. As explained, cutpoints are added and removed to signals to reveal the root cause of a selected cover 204 (an unreachable cover).

The module 200 can be formed of logical circuit components that feed a selected cover 204 that is logically situated as a downstream component. As used herein, the term "downstream component" refers to a component to which signals fan-in. The selected cover 204 represents an unreachable cover. Thus, the selected cover 204 can be employed to implement the selected unreachable cover 168 provided from the formal verification engine 144 of FIG. 1. The selected cover 204 can represent a logical expression that resolves to a value 208. For purposes of simplification of explanation, it is presumed that the selected cover 204 receives signals labeled A and B, and that the selected cover 204 evaluates a logical expression of "A AND B". As explained, because the selected cover 204 is unreachable, the value 208 remains false (logical 0) for every combination of signals searched if no cutpoints are applied.

In the module 200, a sub-module 212 would prevent the selected cover 204 from resolving to a value of true (logical 1). More particularly, the sub-module 212 includes a NOT gate 216 (e.g., a logical inverter) and an OR gate 220. The NOT gate 216 provides an output signal, C and the OR gate 220 provides an output signal D to an AND gate 224 that is downstream from the sub-module 212. The NOT gate 216 and both inputs of the OR gate 220 are driven by a signal E. No matter the value of signal E, the output signals of the sub-module 212 are complementary. That is, if the signal E is true (logical 1), signal C is false (logical 0) and signal D is true (logical 1). Conversely, if signal E is false (logical 0), signal C is true (logical 1) and signal D is false (logical 0). Because the signals C and D are complementary, and the signals C and D are provided to the AND gate 224, a signal F output by the AND gate 224 will remain false (logical 0). Moreover, the signal F is provided to an input of a downstream AND gate 228. Because signal F is false (logical 0), the output of the AND gate 228, signal A, is also false (logical 0). Accordingly, one or more components of the sub-module 212 can be referred to as the root cause of the selected cover 204 being unreachable.

To systematically determine the root cause of the selected cover 204 being unreachable, a multi-stage process can be executed. More particularly, in a first stage, the cutpoint signal searcher 170 of FIG. 1 can search the module 200 for a sufficient set of cutpoint signals that make the selected cover 204 reachable.

To execute the sufficient cutpoint signal search process, the cutpoint signal searcher 170 selects a first set of signals and injects cutpoints into the first set of signals. More particularly, in FIG. 2B, signals A and B with cutpoints 240 that are upstream of the selected cover 204 are selected as a current set of signals 244 and injected with a cutpoint 240. As used herein, the term "upstream signals" denotes signals that fan-in to a downstream logical operator, such that signals A and B are upstream signals for the selected cover 204. Injection of a cutpoint cuts off logic and allows assignment of a value, such that a signal that has an injected cutpoint has a controllable value that is not based on upstream logic. For instance, by setting injecting the cutpoint 240 to signals A and B, signals A and B can be freely assigned values of true or false (logical 0 or logical 1) without regard to upstream logic.

Based on the controllable values for the cutpoints 240 of a current set of signals 244, the cutpoint signal searcher 170 makes a determination as to whether the selected cover 204 is reachable. In the present example, controlling the values for the signals A and B would allow the selected cover 204 to be reachable because the selected cover resolves the value 208 to true (logical 1) in a situation where signals A and B are both true (logical 1).

In situations where the selected set of signals 244 makes the selected cover 204 reachable, the cutpoint signal searcher 170 removes the cutpoints 240 from the selected set of signals 244 and selects a next set of signals that are immediately upstream from the current set of signals 244. FIG. 2C illustrates the module 200 where the cutpoints 240 are removed, and cutpoints 250 are injected onto the next set of signals 254 (immediately upstream from the previous set of signals 244). Thus, in FIG. 2C the next set of signals 254 are the current set of signals 254.

Figure 2A:
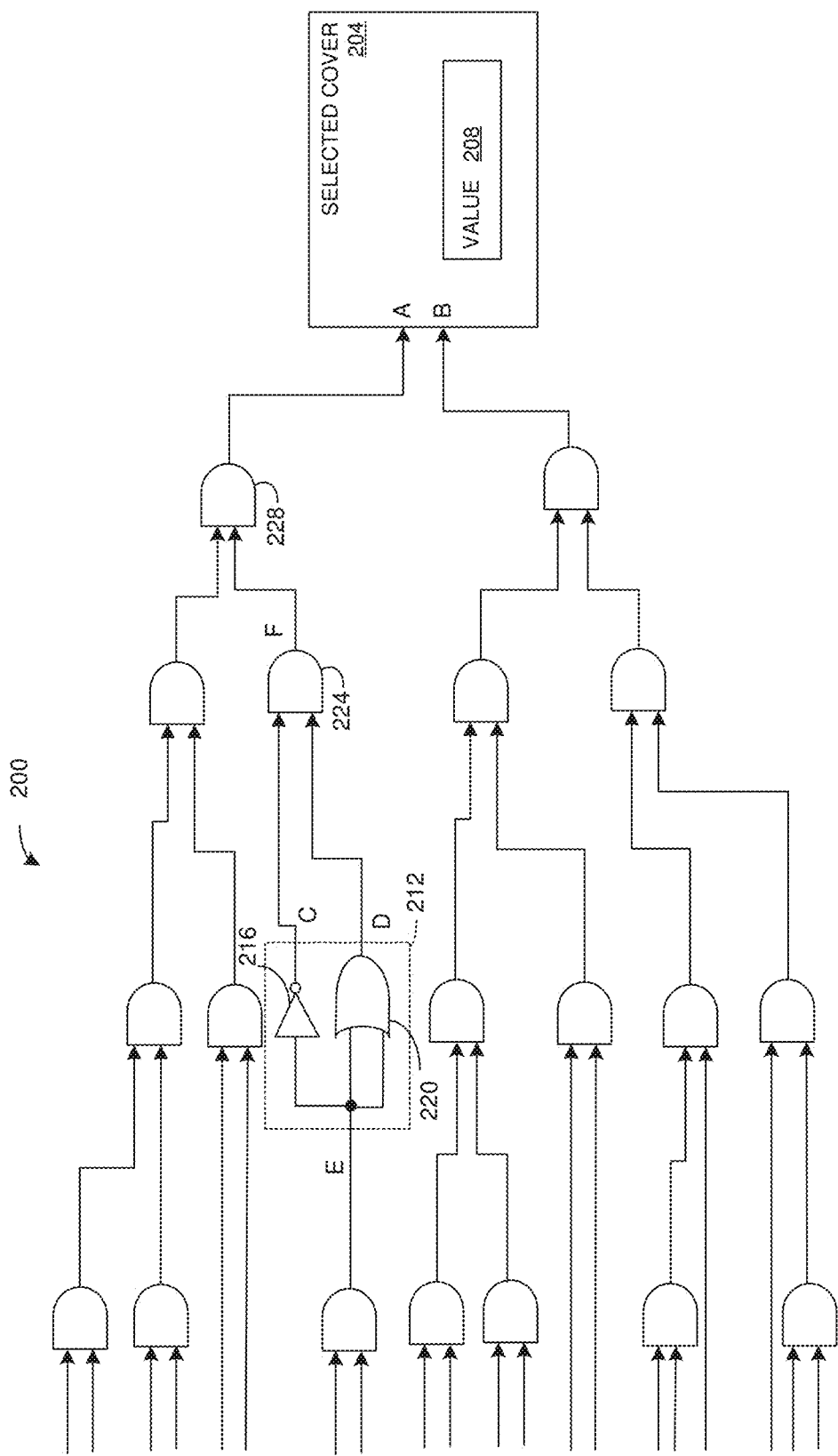
Figure 2B:
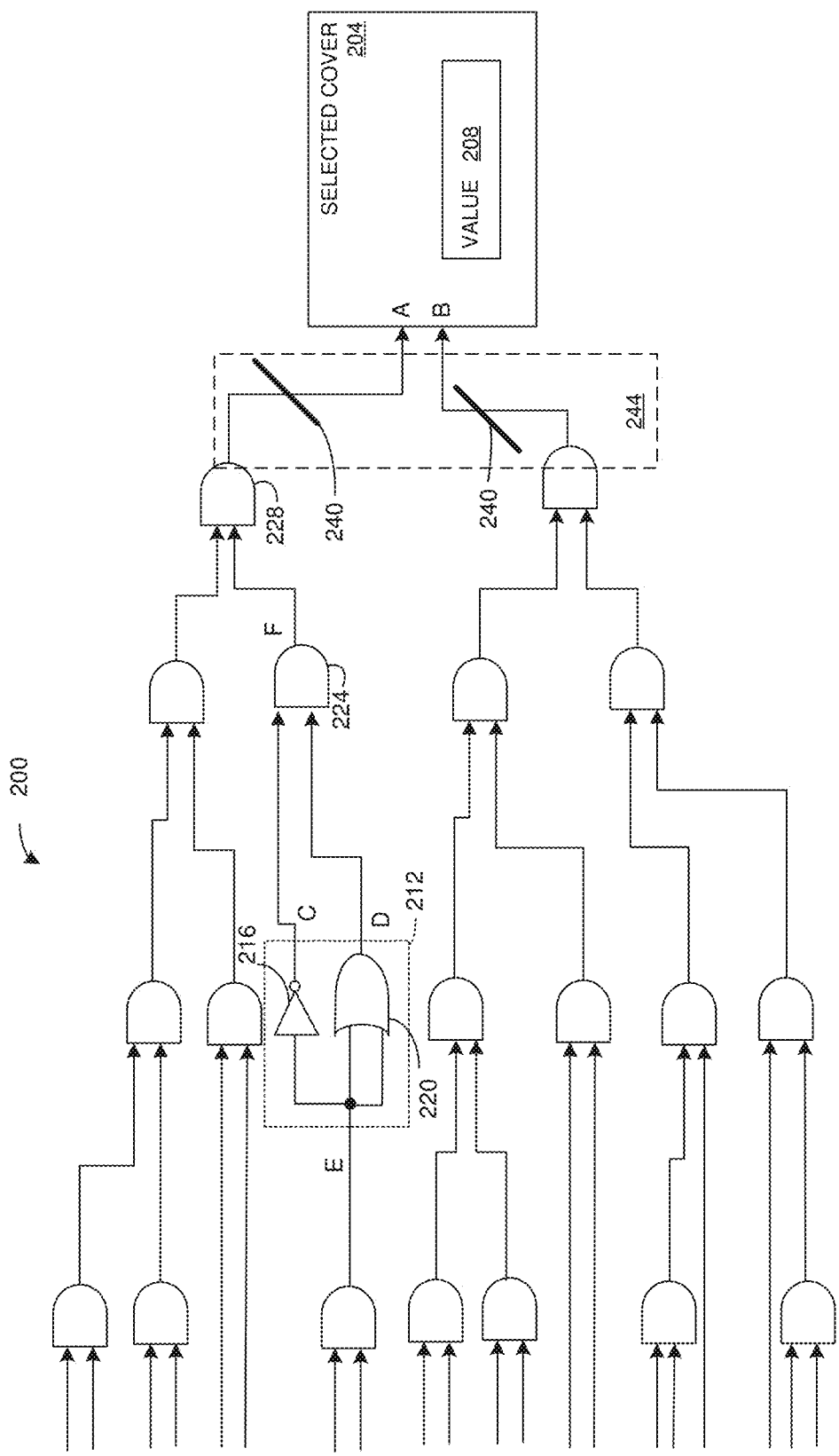
Figure 2D:
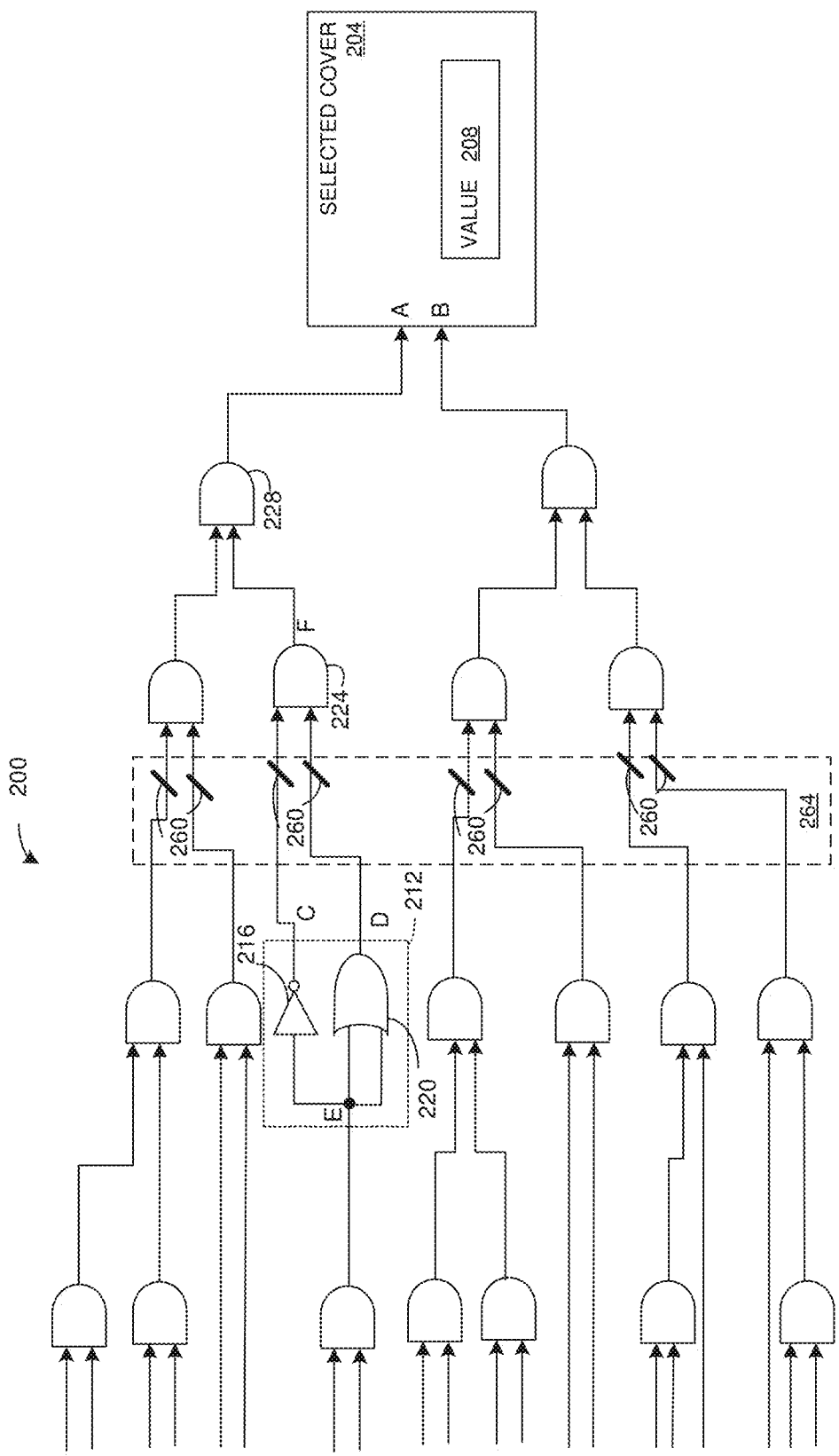

In response to injecting the cutpoints 250 onto the current set of selected signals 254, the cutpoint signal searcher 170 again makes a determination as to whether the selected cover 204 is reachable. In the present example, controlling the values for the set of signals 254 at the cutpoints 250 would allow the selected cover 204 to be reachable. Thus, the cutpoint signal searcher 170 removes the cutpoints 250 from the current selected set of signals 254 and selects a next set of signals that are immediately upstream from the current set of signals 254. FIG. 2D illustrates the module 200 where the cutpoints 250 are removed, and cutpoints 260 are injected onto the next set of signals 264 (immediately upstream from the previous set of signals 254). Thus, in FIG. 2D the next set of signals 264 are the current set of signals 264.

Figure 2E:
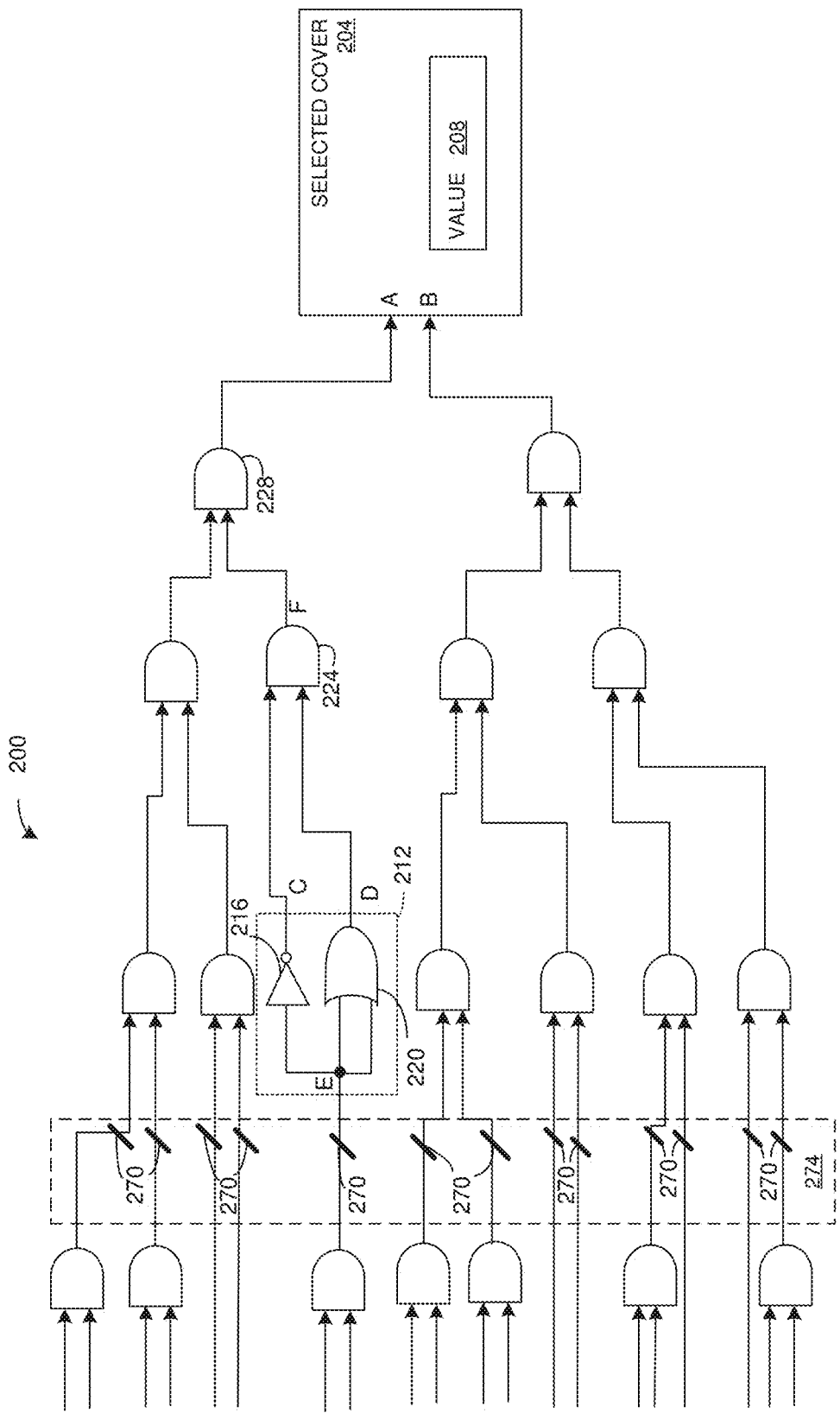

Once again, in response to injecting the cutpoints 260 onto the current set of selected signals 264, the cutpoint signal searcher 170 makes a determination as to whether the selected cover 204 is reachable. In the present example, controlling the values for the signals at cutpoints 260 would allow the selected cover 204 to be reachable. Thus, the cutpoint signal searcher 170 removes the cutpoints 260 from the current selected set of signals 264 and selects a next set of signals that are immediately upstream from the current set of selected set of signals 264. FIG. 2E illustrates the module 200 where the cutpoints 260 are removed, and cutpoints 270 are injected onto the next set of signals 274 (immediately upstream from the previous set of signals 264). Thus, in FIG. 2E the next set of signals 274 are the current set of signals 274.

Once more, in response to injecting the cutpoints 270 onto the current set of signals 274, the cutpoint signal searcher 170 makes a determination as to whether the selected cover 204 is reachable. In the present example, the current set of signals 274 would not make the selected cover reachable. In particular, the current set of signals 274 includes signal E that feeds into the NOT gate 216 and the OR gate 220 of the sub-module 212. Thus, as discussed, no matter what value the signal E is assigned, the value 208 of the selected cover 204 would still resolve to false (logical 0).

In response to determining that the current set of signals 274 do not make the selected cover 204 reachable, the cutpoint signal searcher 170 assigns the previous set of signals 264 (illustrated in FIG. 2D) that are immediately downstream from the current set of signals 274 as the sufficient set of cutpoint signals. The sufficient set of cutpoint signals include the root cause of the bug causing the selected cover 204 to be unreachable. The sufficient set of cutpoint signals are signals that, if cutpoints are applied, can make the selected cover 204 resolve to true (logical 1).

In a second stage of the multi-stage process, the key cutpoint signal searcher 174 of FIG. 1 refines the sufficient set of cutpoint signals to identify a key cutpoint signal (or multiple key cutpoint signals) of the sufficient set of cutpoint signals that is the root cause of the selected cover being made unreachable. The key cutpoint signal searcher 174 iteratively evaluates an impact of subsets of cutpoint signals in the sufficient set of cutpoint signals to determine the root cause that makes the selected cover 204 unreachable.

Figure 2F:
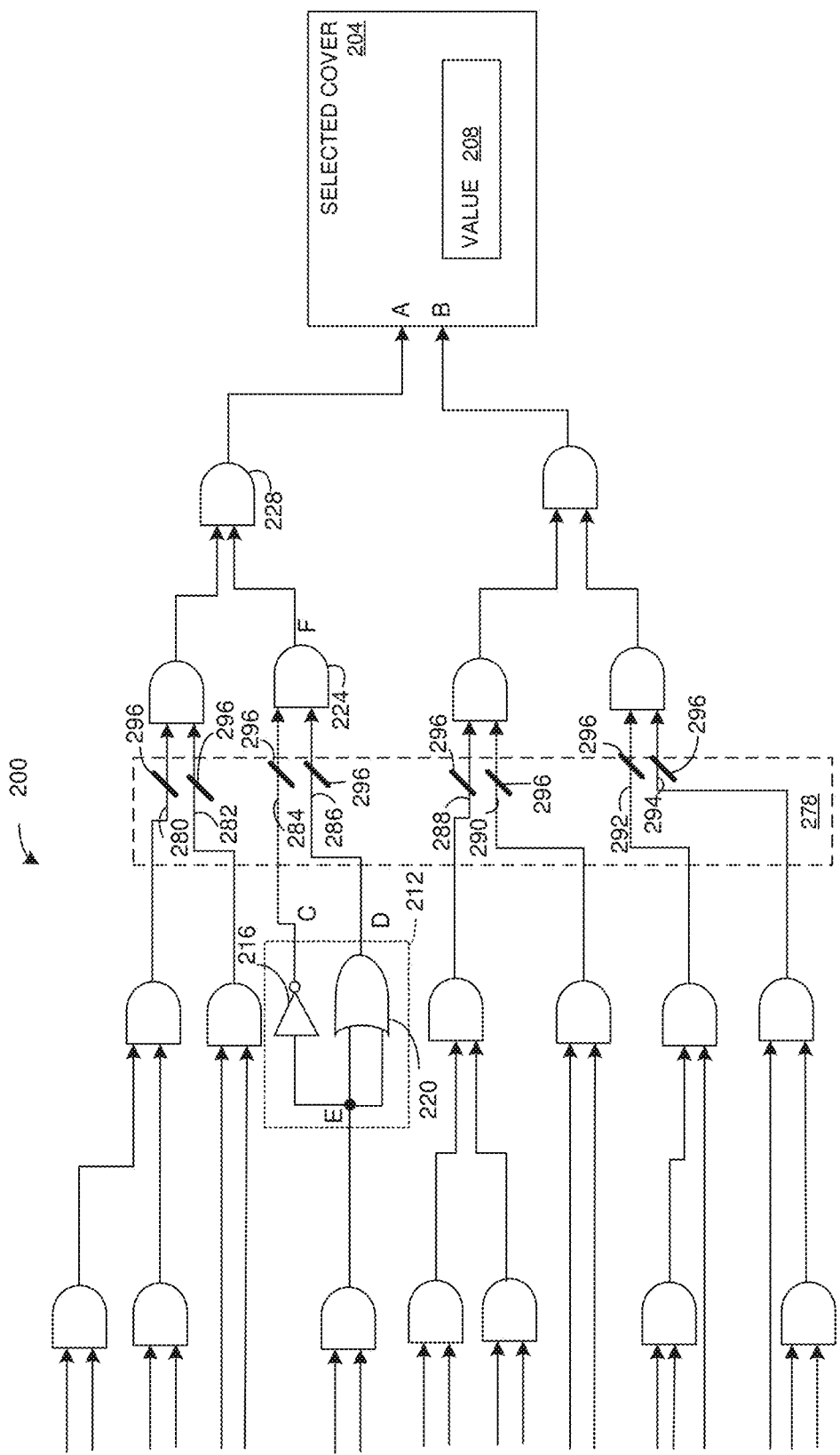

As noted, in the present example, the sufficient set of cutpoint signals 264 are illustrated in FIG. 2D. FIG. 2F illustrates the module 200 where cutpoint signals of the sufficient set of cutpoint signals 278 (re-labeled from FIG. 2D) are labeled with individual reference numbers. More particularly, the sufficient set of cutpoint signals 278 includes first through eighth cutpoint signals 280, 282, 284, 286, 288, 290, 292 and 294. Additionally, a cutpoint 296 is applied to each of the first through eight cutpoint signals 280, 282, 284, 286, 288, 290, 292 and 294.

The key cutpoint signal searcher 174 can selectively remove subsets of cutpoints 296 from signals in the sufficient set of cutpoint signals 278 to determine the impact of each such subset on the reachability of the selected cover 204. In the examples illustrated in FIGS. 2G-2K, individual cutpoints 296 are removed from signals (e.g., one cutpoint signal per subset). However, in other examples, multiple cutpoints 296 can be removed in each iteration (e.g., multiple cutpoint signals per subset). The subset can be can be randomly selected, selected in a predicted order, selected by a rank of a number of floating-point operations per second (flops), a number of layers of fan-in in the module, etc.

Figure 2G:
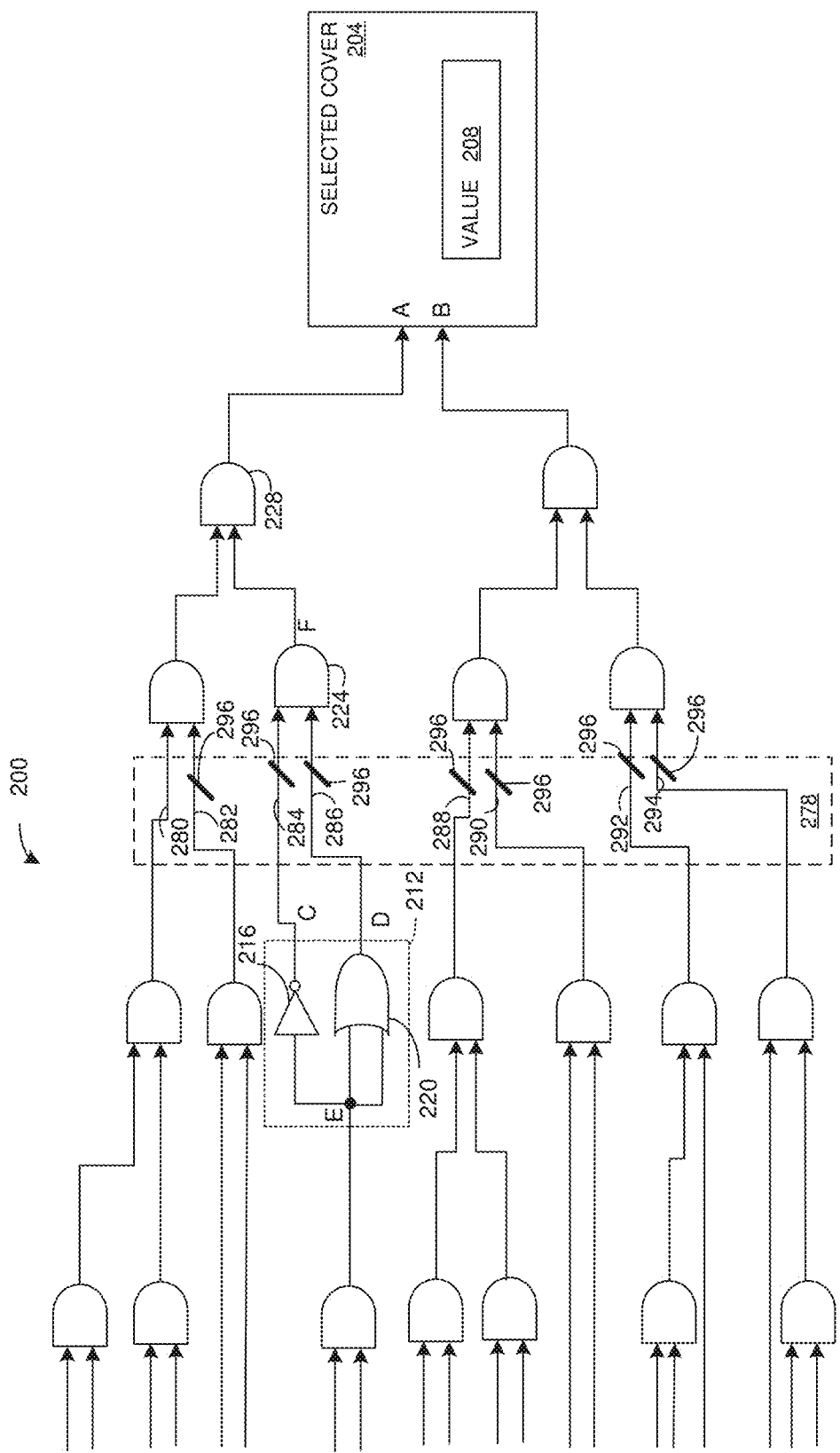
Figure 2H:
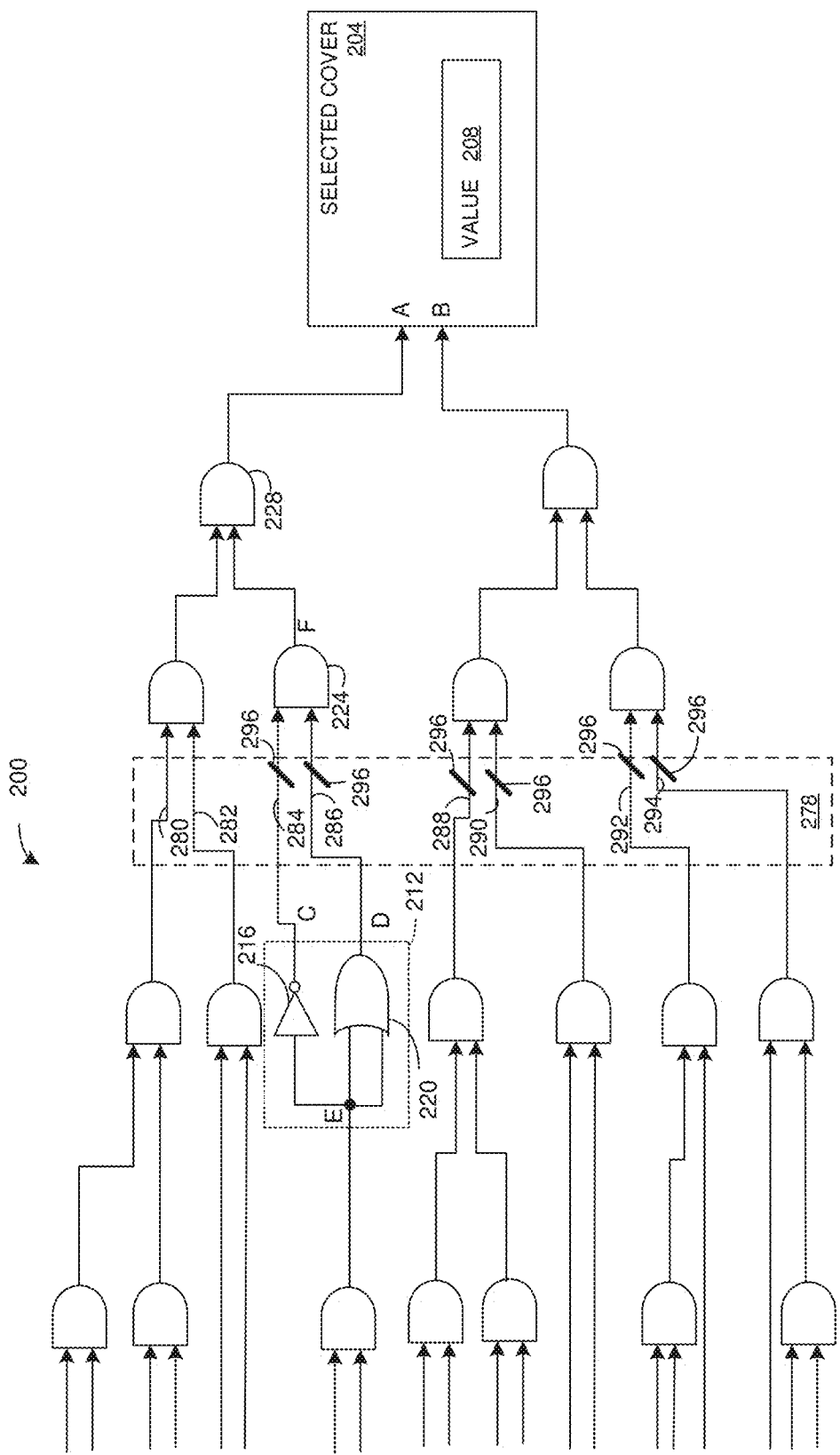
Figure 21:
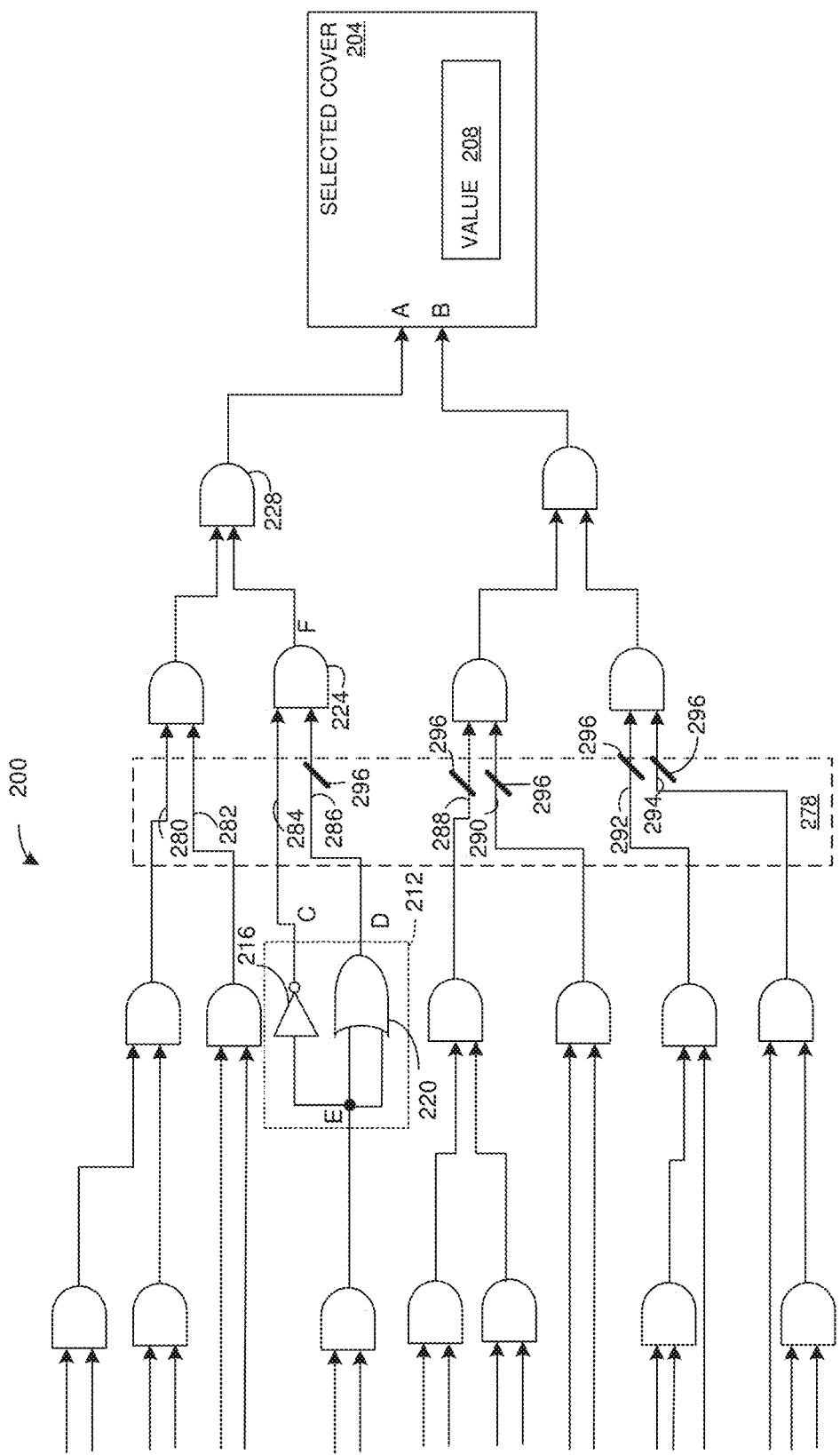

More particularly, as illustrated in FIG. 2G, the cutpoint 296 of the first cutpoint signal 280 is removed. The key cutpoint signal searcher 174 makes a determination as to whether the selected cover 204 is still reachable. In the example illustrated, the value 208 of the selected cover 204 can still resolve to true (logical 1), such that the selected cover 204 is reachable if the cutpoint 296 of the first selected cutpoint signal 280 is removed. Thus, the key cutpoint signal searcher 174 can remove a next subset of cutpoints 296 for signals in the sufficient set of cutpoint signals 278. In FIG. 2H, the cutpoint 296 is removed from the second cutpoint signal 282, and the key cutpoint signal searcher 174 makes another determination as to whether the selected cover 204 is still reachable. In the example illustrated, the value 208 of the selected cover 204 can still resolve to true (logical 0), such that the selected cover 204 is reachable if the cutpoints for both the first cutpoint signal 280 and the second cutpoint signal 282 are removed. Thus, the key cutpoint signal searcher 174 can remove a next subset of cutpoint signals.

In FIG. 2I, the cutpoint 296 is removed from the third cutpoint signal 284, and the key cutpoint signal searcher 174 makes another determination as to whether the selected cover 204 is still reachable. In the example illustrated, the value 208 of the selected cover 204 can still resolve to true (logical 1) because signal E, which is driving the NOT gate 216 can have a value of false (logical 0), which causes signal C to be true (logical 1). In such a situation, the fourth cutpoint signal 286 can be set to true (logical 1), such that signal F is also true (logical 1), which can ultimately cause the value 208 of the selected cover 204 to resolve to true (logical 1). Thus, the key cutpoint signal searcher 174 can remove a next subset of cutpoint signals.

Figure 2J:
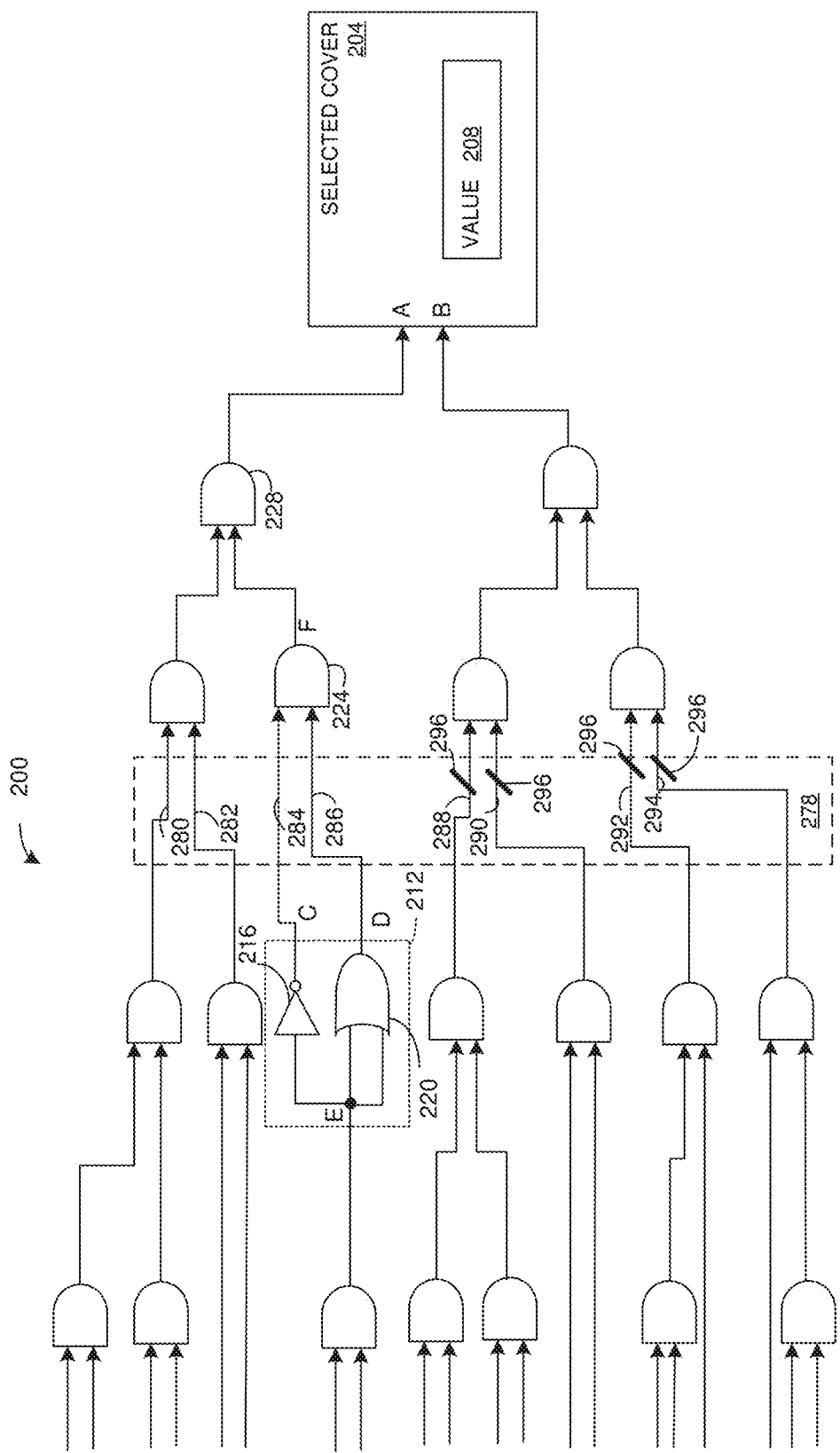

In FIG. 2J, the cutpoint 296 applied to the fourth cutpoint signal 286 is removed, and the key cutpoint signal searcher 174 makes another determination as to whether the selected cover 204 is still reachable. In the example illustrated, the value 208 of the selected cover 20 resolves to false (logical 0) because as noted, in normal operations (e.g., without cutpoint applied), the outputs of the sub-module 212, namely signals C and D are complementary. Thus, the output of the AND gate 224, namely signal F will be false (logical 0) no matter the value of signal E that drives the inputs to the sub-module 212.

Figure 2K:
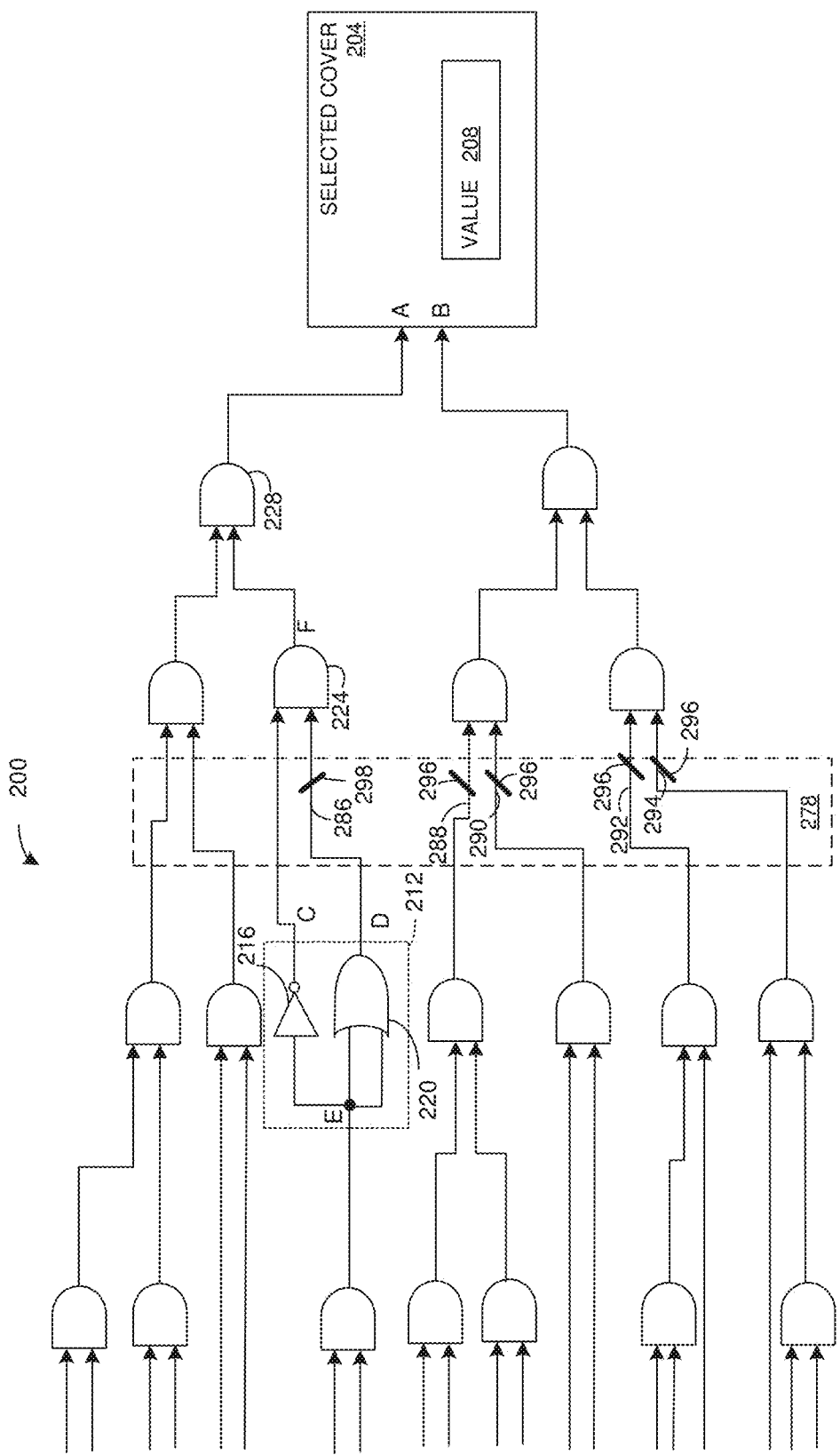

In response to determining that the removal of the cutpoint 296 for the fourth cutpoint signal 286 causes the selected cover 204 to be unreachable, the key cutpoint signal searcher 174 can mark the fourth cutpoint signal 286 (as a root cause of the selected cover 204 being unreachable. FIG. 2K illustrates the module 200 wherein the cutpoint 298 for the fourth cutpoint signal 286 has been marked.

In some examples, the key cutpoint signal searcher 174 can terminate the search. In other examples, the key cutpoint signal searcher 174 can continue the search. In this situation, the key cutpoint signal searcher 174 can re-add cutpoint 298 to the fourth cutpoint signal 286 and iteratively remove the cutpoints 296 from the fifth through eight cutpoint signals 288, 290, 292 and 294 and test whether the selected cover 204 is still reachable in a manner described. In the example illustrated in FIG. 2K removal of the cutpoints 296 from the fifth through eight cutpoint signals 288, 290, 292 and 294 (or any combination thereof) does not cause the selected cover 204 to be unreachable if the cutpoint 298 is still applied to the fourth cutpoint signal 286. Thus, the signal D provided from the OR gate 220 can be identified by the key cutpoint signal searcher 174 as the root cause of the selected cover 204 being unreachable.

Referring back to FIG. 1, the unreachable cover engine 160 can provide the formal verification engine 144 with the root cause of the selected unreachable cover 168. In response, the formal verification engine 144 can output data characterizing the unreachable cover root cause 178 in the evaluation 148. The process can be repeated for each of the unreachable covers 164 or some subset thereof.

The evaluation 148 can be provided to the remote system 116, such that a designer can examine the features of the evaluation 148, including the unreachable cover root cause 178 (or multiple instances of the unreachable cover root cause 178). In some examples, data characterizing the cover trace 156 (or multiple cover traces), the unreachable cover root cause 178 (or multiple instances of the unreachable cover root cause) and/or a counter-example trace can be output in a GUI viewable the designer. The designer can employ an EDA application (e.g., a logic synthesis application) to update the circuit design 104, such that the formal verification engine 144 can re-execute the formal verification.

By implementing the formal verification engine 144 with the unreachable cover engine 160, the circuit designer is provided with valuable information identifying why particular unreachable covers of the list of cover 128 are unreachable, namely, the unreachable cover root cause 160. This information can streamline re-design of the circuit design 104 by obviating the need for the circuit designer to manually trace each unreachable cover.

Figure 3:
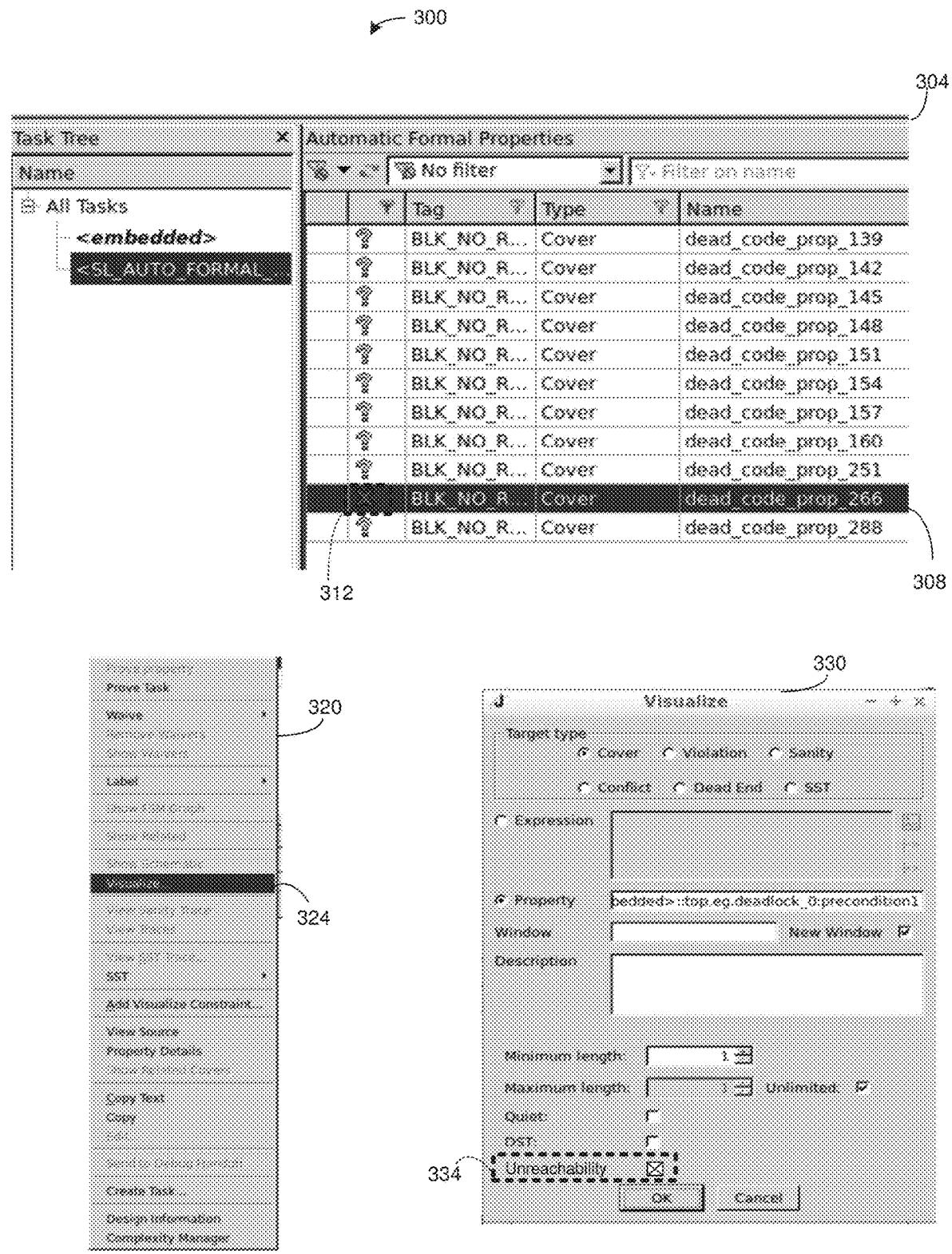
FIG. 3 illustrates a portion of a graphical user interface (GUI) for visualizing an unreachable cover.

FIG. 3 illustrates an example of a portion of a GUI 300 that can be provided by the EDA application 140 of FIG. 1 for controlling an outputting of data characterizing a root cause of an unreachable cover, such as an instance of the unreachable cover root cause 160 of FIG. 1. The GUI 300 includes an array of properties 304. The array of properties 304 includes a list of covers that could represent a portion of the list of covers 128 of FIG. 1. The array of properties 304 includes a highlighted row 308 that defines properties to the unreachable cover, as indicated by an icon 312 in the highlighted row 308.

Actuation of user input (e.g., a mouse click) can cause a pull down menu 320 to appear in the GUI 300. The pull down menu 320 includes a selectable feature 324 labeled "Visualize" that causes a visualization menu 330 (e.g., a pop-up menu) to appear on the GUI 300. The visualization menu 330 can include an unreachability option 334. If the unreachability option 334 is selected, the data characterizing the root cause of the unreachable cover identified by the row 308 can be searched for and output.

Figure 4:
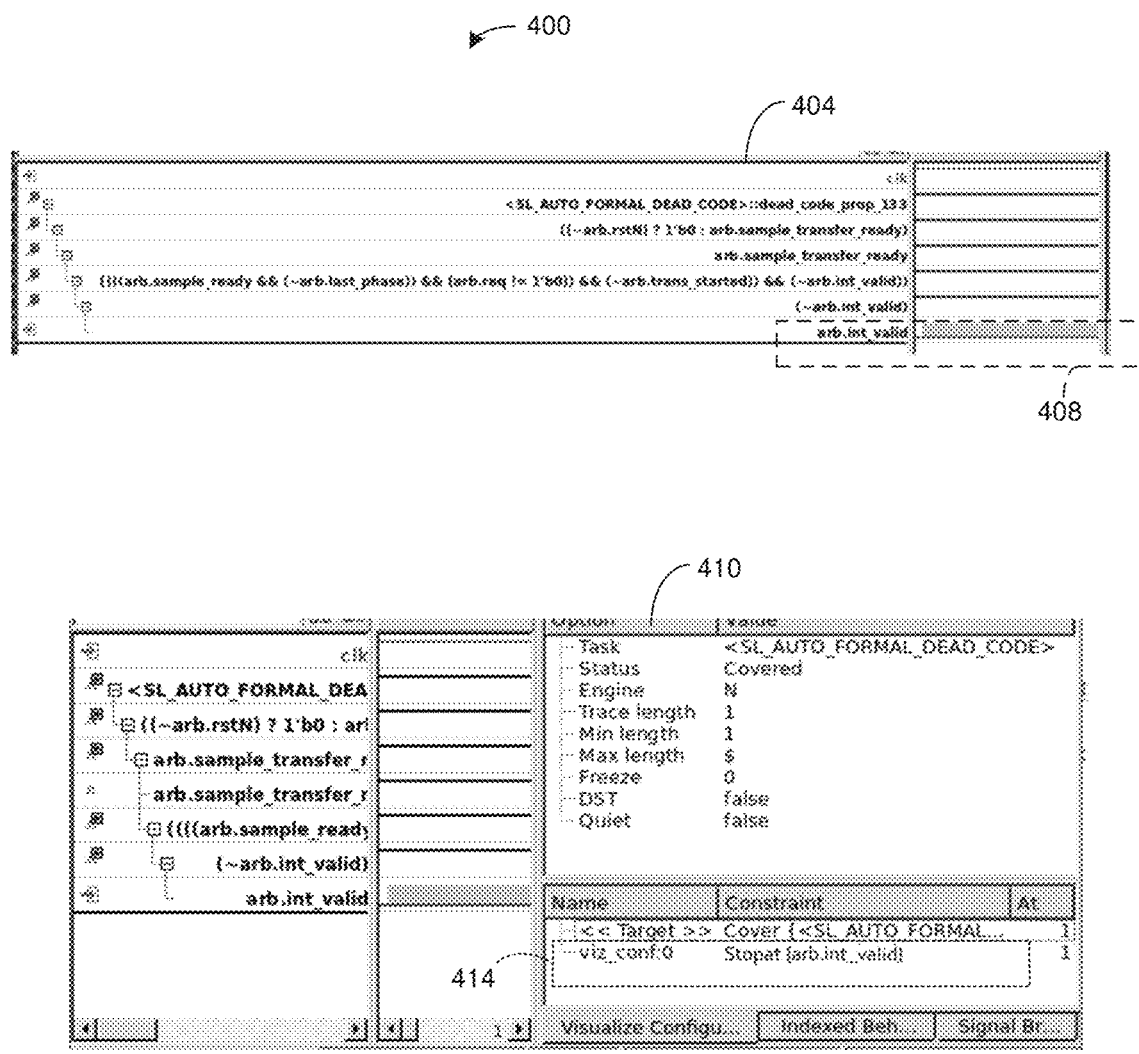
FIG. 4 illustrates another portion of a GUI for visualizing an unreachable cover.

FIG. 4 illustrates an example of another portion of the GUI 400 that can be provided by the EDA application 140 of FIG. 1 that outputs data characterizing a root cause of an unreachable cover, such as an instance of the unreachable cover root cause 160 of FIG. 1. The GUI 400 includes a fan-in tree 404 (a hierarchical list) that lists each signal (waveform) from the unreachable cover to a key cutpoint 408 (e.g., the root cause) of the unreachable cover. The key cutpoint 408 has a visual indicia (e.g., highlighting) to denote that the cutpoint signal is applied. Selection of the key cutpoint 408 causes the GUI 300 to output a visualization window 410. The visualization window 410 provides data characterizing details of the key cutpoint 408, including a command 414 to actuate the cutpoint (e.g., labeled as a "stopat"). Accordingly, a circuit designer can edit and/or remove the cutpoint from the signal. By implementing the GUI 300 of FIG. 3 and the GUI 400 of FIG. 4, useful information pertaining to unreachable covers can be provided to the circuit designer. In particular, the GUI 300 and the GUI 400 provide data characterizing a root cause of an unreachable cover that allows the circuit designer to address this root cause, thereby streamlining the debugging process.

Figure 5:
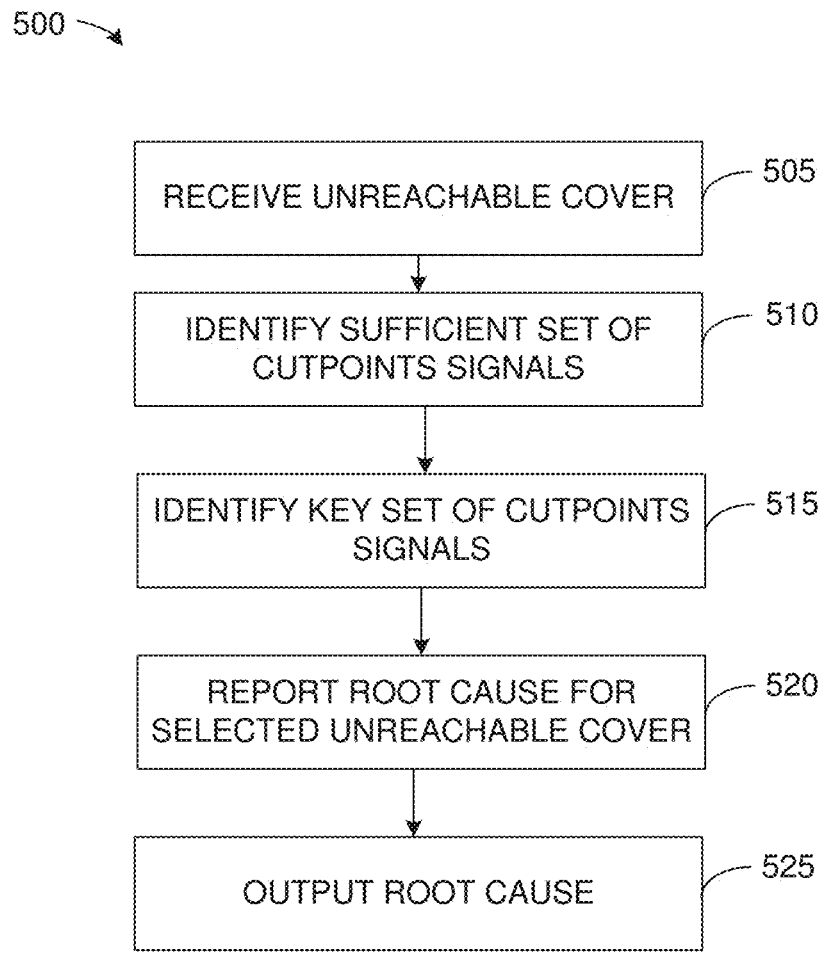
FIG. 5 illustrates a flowchart of an example method for determining a root cause of an unreachable cover.
Figure 6:
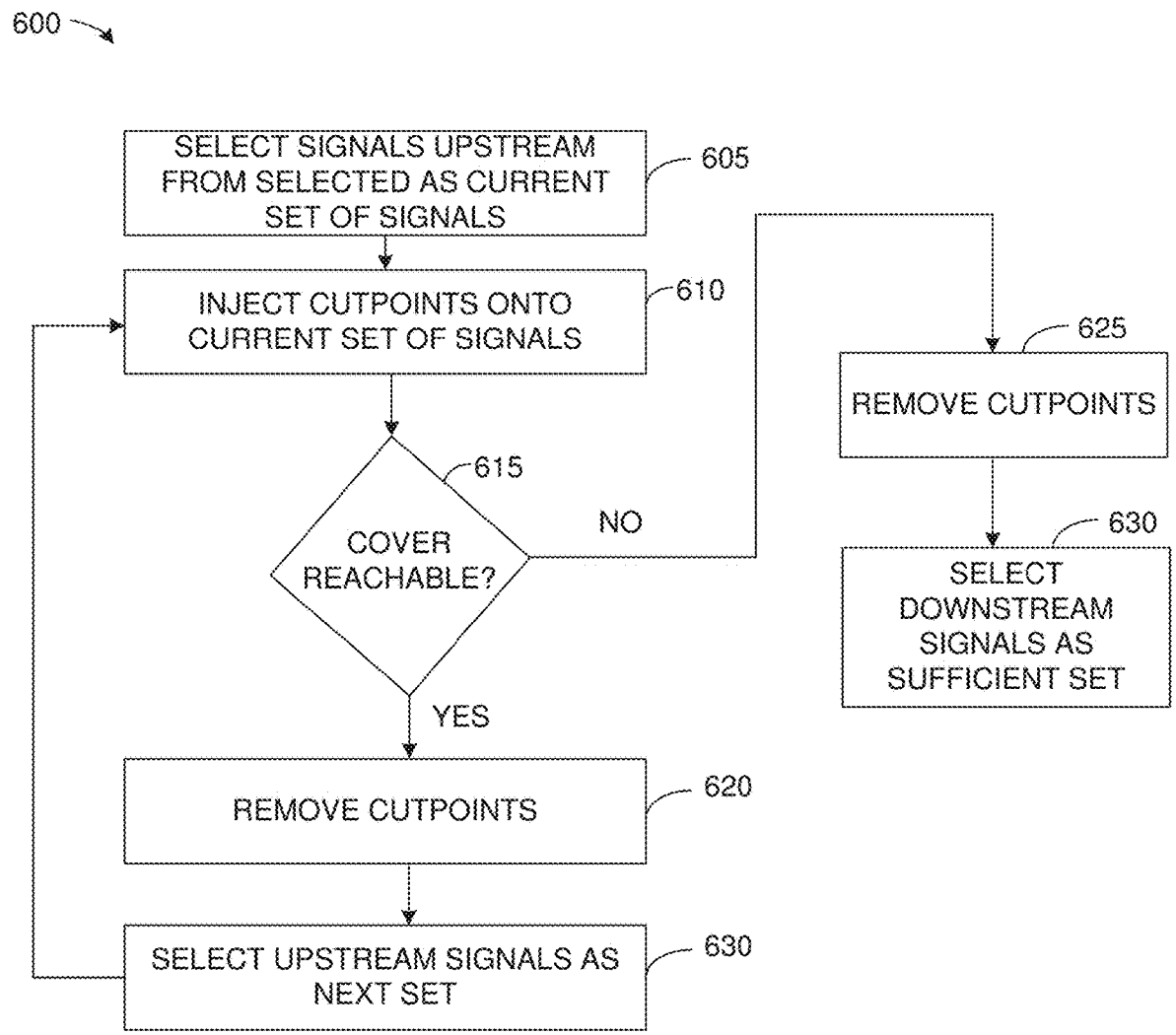
FIG. 6 illustrates a flowchart of an example method for executing a search for a sufficient set of cutpoint signals for an unreachable cover.
Figure 7:
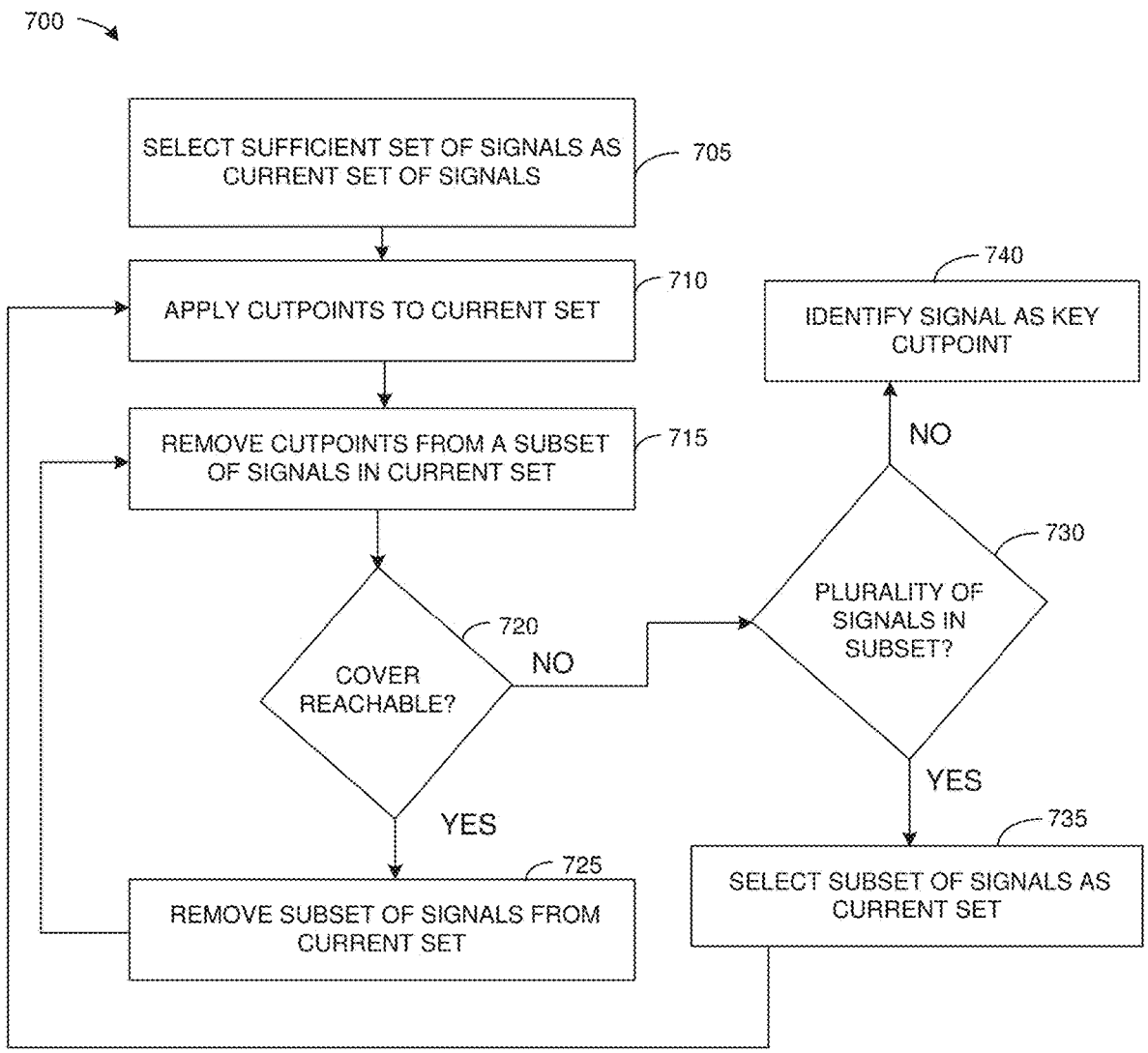
FIG. 7 illustrates a flowchart of an example method for identifying a set of key cutpoints signals from a sufficient set of cutpoint signals.

In view of the foregoing structural and functional features described above, example methods will be better appreciated with reference to FIGS. 5-7. While, for purposes of simplicity of explanation, the example methods of FIG. 5-7 are shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 5 illustrates a flowchart of an example method 500 for determining a root cause of a selected cover that is unreachable in a circuit design, such as the selected unreachable cover 168 of FIG. 1. The method 500 can be executed as part of a formal verification of the circuit design. The method 500 can be executed, for example by the unreachable cover engine 160 of FIG. 1. At 505, the unreachable cover engine can receive the selected cover. In some examples, the unreachable cover can be selected by a formal verification engine (e.g., the formal verification engine 144 of FIG. 1). In other examples, the unreachable cover engine can receive a list of unreachable covers, and the unreachable cover engine can select a particular cover from the list of unreachable covers.

At 510, the unreachable cover engine can identify a sufficient set of cutpoints signals that define signals, for which cutpoints can be applied to make the selected cover reachable. At 515, the unreachable cover engine can refine the sufficient set of cutpoints signals to identify a set of key cutpoint signals. The set of key cutpoint signals can be a subset of the sufficient set of cutpoint signals. In some examples, the set of key cutpoints signals can be a single signal. In other examples, there can be multiple signals in the set of key cutpoint signals. At 520, the key cutpoint signals can be reported as a root cause of the selected cover being unreachable. At 525, a GUI can output data characterizing the root cause of the selected cover. Accordingly, a circuit designer can update the circuit design.

FIG. 6 illustrates a flowchart of an example method 600 for executing a search for a sufficient set of cutpoint signals for a selected cover. The sufficient set of cutpoint signals defines a set of signals, that if cutpoints are applied thereon, allow the selected cover to be reachable. The method 600 can be implemented, for example, by the cutpoint signal searcher 170 of FIG. 1. The method 600 can be executed on a circuit design, such as the circuit design 104 of FIG. 1. More particularly, the method 600 can be executed on a module of the circuit design, such as the module 200 illustrated in FIGS. 2A-2K.

The method 600 can be executed as a sub-method implemented as the action 510 of the method 500 of FIG. 5. Thus, it is presumed that the selected cover that is unreachable is provided to the cutpoint signal searcher. At 605, the cutpoint signal searcher can select signals upstream from the selected cover as a current set of signals. Thus, the current set of signals fan-in to the selected cover.

At 610, the cutpoint signal searcher injects cutpoints onto the current set of signals. At 615, the cutpoint signal searcher makes a determination as to whether the selected cover is reachable with the injected cutpoints. If the determination at 615 is positive (e.g., YES), the method proceeds to 620. If the determination at 615 is negative (e.g., NO), the method proceeds to 625.

At 620, the cutpoint signal searcher removes the cutpoints injected onto the current set of signals from the circuit design. At 630, the cutpoint signal searcher selects a next set of signals as the current set of signals. The next set of signals are upstream from the previous set of signals. The method 600 returns to 610.

At 625, the cutpoint signal searcher removes the cutpoints injected onto the current set of signals from the circuit design. At 630, the cutpoint signal searcher selects a previous set of signals that are downstream from the current set of signals as the sufficient set of cutpoint signals for the selected cover.

FIG. 7 illustrates a flowchart of an example method 700 for identifying a set of key cutpoints signals that are a subset of signals in a sufficient set of signals, which correspond to a root cause of a selected cover being unreachable. The method 700 can be executed as a sub-method implemented as the action 515 of the method 500 of FIG. 5. The method 700 can be executed by a key cutpoint signal searcher, such as the key cutpoint signal searcher 174 of FIG. 1. Thus, in the method 700, it is presumed that the key cutpoint signal searcher received the sufficient set of cutpoint signals for reaching the selected cover are provided form a cutpoint signal searcher, such as the cutpoint signal searcher 170 of FIG. 1.

At 705, the key cutpoint signal searcher can select the sufficient set of cutpoint signals as a current set of signals. At 710, the key cutpoint signal searcher can apply cutpoints to the current set of signals in the circuit design. At 715, the key cutpoint searcher can remove the cutpoints from a selected subset of the current set of signals. The subset of signals can be randomly selected, selected in a predicted order, selected by a rank of a number of flops, a number of layers of fan-in in the circuit design, etc. The list provided it is not intended to be exhaustive. In other examples, additional or alternative methods can be employed to select the subset of signals.

At 720, the key cutpoint signal searcher makes a determination as to whether the selected cover is reachable with the cutpoints removed from the selected subset of signals. If the determination at 720 is positive (e.g., YES), the method 700 proceeds to 725. If the determination at 700 is negative (e.g., NO), the method 700 proceeds to 730. At 725, the selected subset of signals (with the cutpoints removed at 715) are removed from the current set of signals and the method 700 returns to 715.

At 730, the key cutpoint signal searcher makes a determination as to whether there are multiple signals in the selected subset of signals. If the determination is positive (e.g., YES), the method 700 proceeds to 735. If the determination at 730 is negative (e.g., NO), the method 700 proceeds to 740. At 735, the key cutpoint signal searcher sets the subset of signals to the current set of signals, and the method 700 returns to 710.

At 740, the single signal in the subset of signals is identified as a key cutpoint signal for reaching the cover. That is, in order to reach the selected cover, a cutpoint must be applied to the key cutpoint signals. Other signals (if any) in the current set of signals represent a set of signals, wherein application of a cutpoint to each of the set of signals and to the key cutpoint signal make the selected cover reachable. Thus, the key cutpoint signal can be provided as a root cause of the selected cover being unreachable.

Figure 8:
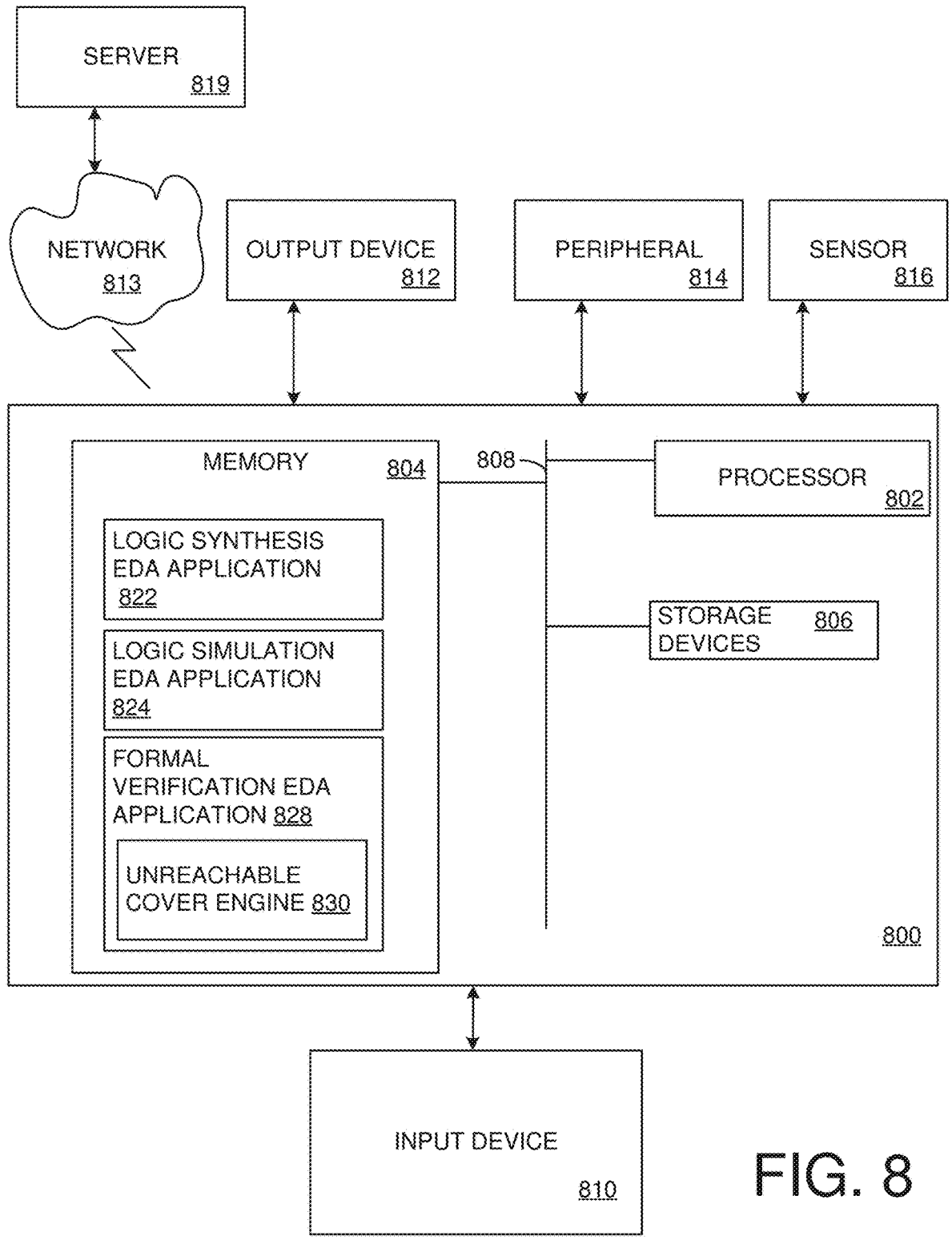
FIG. 8 illustrates an example of a computing system employable to execute a plurality of EDA applications including a formal verification EDA application with an unreachable cover engine.

The examples herein may be implemented on virtually any type of computing system regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory and input and output device(s) to perform one or more embodiments. As shown in FIG. 8, the computing system 800 can include a computer processor 802, associated memory 804 (e.g., RAM, cache memory, flash memory, etc.), one or more storage devices 806 (e.g., a solid state drive, a hard disk drive, an optical drive such as a compact disk (CD) drive or digital versatile disk (DVD) drive, a flash memory stick, etc.) and numerous other elements and functionalities. The computer processor 802 may be an integrated circuit for processing instructions. For example, the computer processor may be one or more cores, or microcores of a processor. Components of the computing system 800 can communicate over a data bus 808.

The computing system 800 may also include an input device 810, such as any combination of one or more of a touchscreen, keyboard, mouse, microphone, touchpad, electronic pen, or any other input device. Further, the computing system 800 can include an output device 812, such as one or more of a screen (e.g., light emitting diode (LED) display, an organic light emitting diode (OLED) display, a liquid crystal display (LCD), a plasma display, touchscreen, cathode ray tube (CRT) monitor, projector, or other display device), a printer, external storage, or any other output device. In some examples, such as a touch screen, the output device 812 can be the same physical device as the input device 810. In other examples, the output device 812 and the input device 810 can be implemented as separate physical devices. The computing system 800 can be connected to a network 813 (e.g., a local area network (LAN), a wide area network (WAN) such as the Internet, a mobile network, or any other type of network) via a network interface connection (not shown). The input device 810 and output device(s) 812 can be connected locally and/or remotely (e.g., via the network 813) to the computer processor 802, the memory 804 and/or the storage device 806. Many different types of computing systems exist, and the aforementioned input device 810 and the output device 812 can take other forms. The computing system 800 can further include a peripheral 814 and a sensor 816 for interacting with the environment of the computing system 800 in a manner described herein.

Software instructions in the form of computer readable program code to perform embodiments disclosed herein can be stored, in whole or in part, temporarily or permanently, on a non-transitory computer readable medium such as a CD, DVD, storage device, a diskette, a tape, flash memory, physical memory, or any other computer readable storage medium. Specifically, the software instructions can correspond to computer readable program code that when executed by a processor, is configured to perform operations disclosed herein. The computing system 800 can communicate with a server 819 via the network 813.

The memory 804 can include a plurality of EDA applications that can be employed to generate a circuit design and/or execute a simulation of the circuit design, a DBH verification or a formal verification. More particularly, the memory 804 can include a logic synthesis EDA application 822, a logic simulation EDA application 824 and a formal verification EDA application 828 or any combination of these EDA applications. The formal verification EDA application 828 can execute an unreachable cover engine 830 to identify a root cause of unreachable covers in a manner described herein.

Further, one or more elements of the aforementioned computing system 800 can be located at a remote location and connected to the other elements over a network 813. Additionally, some examples can be implemented on a distributed system having a plurality of nodes, where each portion of an embodiment can be located on a different node within the distributed system. In one example, the node corresponds to a distinct computing device. Alternatively, the node can correspond to a computer processor with associated physical memory. The node can alternatively correspond to a computer processor or micro-core of a computer processor with shared memory and/or resources.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A non-transitory machine-readable medium having machine-readable instructions, the machine-readable instructions comprising a formal verification electronic design automation (EDA) application, the formal verification EDA application being configured to:
   receive a circuit design of an integrated circuit (IC) chip, the circuit design of the IC chip comprising a list of properties for the IC chip, wherein the list of properties comprises a list of covers for the IC chip;
   execute a formal verification of the IC chip, wherein results of the formal verification identifies a subset of covers of the list of covers that are unreachable; and
   execute a root cause search for a selected cover in the subset of covers that are unreachable, wherein the root cause search selectively adds and removes cutpoints to signals in the circuit design to identify a root cause for the selected cover being unreachable, wherein the root cause comprises a signal in the circuit design that is upstream from the selected cover.

2. The medium of claim 1, wherein the execution of the root cause search further comprises:
   identifying a sufficient set of cutpoint signals that, if cutpoints are injected thereon, allow the selected unreachable cover to be reached; and
   selecting a set of key cutpoint signals from the sufficient set of cutpoint signals as the root cause for the selected cover.

3. The medium of claim 2, wherein the identifying further comprises:
   selecting a current set of signals fanning into a given set of logical operators for the selected cover; and
   iteratively executing a search to determine the sufficient set of cutpoint signals.

4. The medium of claim 3, wherein each execution of the search that is iteratively executed comprises:
   injecting cutpoints on to the current set of signals to determine if the selected cover is reachable with the injected cutpoints onto the current set of signals;
   determining whether the selected cover is reachable with the current set of signals with injected cutpoints;
   choosing a prior set of signals as the sufficient set of cutpoint signals in response to determining that the selected cover is unreachable with the current set of signals with injected cutpoints; and
   changing the current set of signals to a next set of signals fanning into another set of logical operators logically situated upstream from the given set of logical operators in response to determining that the selected cover is reachable with the current set of signals with injected cutpoints.

5. The medium of claim 2, wherein selecting the set of key cutpoint signals of the sufficient set of cutpoint signals further comprises:
   applying cutpoints to a current set of signals of the sufficient set of signals; and
   iteratively executing a search to determine the set of key cutpoint signals from the sufficient set of cutpoint signals.

6. The medium of claim 5, wherein each execution of the search that is iteratively executed comprises:
   removing the applied cutpoints to a selected subset of the current set of signals;
   determining whether the selected cover is reachable with a remaining subset of signals of the current set of signals;
   changing the current set of signals to the remaining subset of signals in response to determining that the cover is reachable with cutpoints applied to the remaining subset of signals; and
   setting the key cutpoint signals to the selected subset of signals in response to determining that the cover is not reachable without cutpoints applied to the selected subset of signals.

7. The medium of claim 6, wherein the key cutpoint signals is a single signal that corresponds to the root cause of the selected cover being unreachable.

8. The medium of claim 1, further comprising a graphical user interface (GUI) that outputs data characterizing the root cause of the selected cover that is unreachable.

9. The medium of claim 8, wherein the GUI outputs data characterizing a trace for a particular cover in the list of covers that is reachable, wherein the trace comprises a set of conditions that cause the particular cover to resolve to a true condition.

10. A method for determining a root cause of an unreachable cover, the method comprising:
receiving, by a formal verification electronic design automation (EDA) application, a circuit design of an integrated circuit (IC) chip, the circuit design of the IC chip comprising a list of properties for the IC chip, wherein the list of properties comprises a list of covers for the IC chip;
executing, by the formal verification EDA application, a formal verification of the IC chip, wherein results of the formal verification identify a subset of covers of the list of covers that are unreachable;
identifying, by the formal verification EDA application, a sufficient set of cutpoint signals, that if cutpoints are applied thereon, make a selected cover of the subset of covers reachable; and
selecting, by the formal verification EDA application, a set of key cutpoint signals from the sufficient set of cutpoint signals to determine a root cause of the selected cover being unreachable.

11. The method of claim 10, wherein the execution of the root cause search further comprises:
selecting a current set of signals fanning into a given set of logical operators upstream from a logical operator for the selected cover;
iteratively executing a search to determine the sufficient set of cutpoint signals.

12. The method of claim 11, wherein each execution of the search that is iteratively executed comprises:
injecting cutpoints on to the current set of signals to determine if the selected cover is reachable with the injected cutpoints onto the current set of signals;
determining whether the selected cover is reachable with the current set of signals with injected cutpoints;
choosing a prior set of signals as the sufficient set of cutpoint signals in response to determining that the selected cover is unreachable with the current set of signals with injected cutpoints; and
changing the current set of signals to a next set of signals fanning into another set of logical operators upstream from the given set of logical operators in response to determining that the selected cover is reachable with the current set of signals with injected cutpoints.

13. The method of claim 10, wherein selecting the set of key cutpoint signals of the sufficient set of cutpoint signals further comprises:
applying cutpoints to a current set of signals of the sufficient set of signals; and
iteratively executing a search to determine the set of key cutpoint signals from the sufficient set of cutpoint signals.

14. The method of claim 13, wherein each execution of the search that is iteratively executed comprises:
removing the applied cutpoints to a selected subset of the current set of signals;
determining whether the selected cover is reachable with a remaining subset of signals of the current set of signals;
changing the current set of signals to the remaining subset of signals in response to determining that the cover is reachable with cutpoints applied to the remaining subset of signals; and
setting the key cutpoint signals to the selected subset of signals in response to determining that the cutpoint is not reachable without applying cutpoints to the key cutpoint signals.

15. The method of claim 14, wherein the key cutpoint signals is a single signal that corresponds to the root cause of the selected cover being unreachable.

16. The method of claim 10, further comprising outputting, via a graphical user interface (GUI), data characterizing the root cause of the selected cover that is unreachable.

17. A system comprising:
a non-transitory memory to store machine-readable instructions; and
a processor to access the memory and execute the machine-readable instructions, the machine-readable instructions comprising:
a formal verification electronic design automation (EDA) application, the formal verification EDA application being configured to:
receive a circuit design of an integrated circuit (IC) chip, the circuit design of the IC chip comprising a list of properties for the IC chip, wherein the list of properties comprises a list of covers for the IC chip;
execute a formal verification of the IC chip, wherein results of the formal verification identify a subset of covers of the list of covers that are unreachable; and
execute a root cause search for a selected cover in the subset of covers that are unreachable, wherein the root cause search selectively adds and removes cutpoints to signals in the circuit design to identify a root cause for the selected cover being unreachable, wherein the root cause comprises a signal in the circuit design that is upstream from the selected cover.

18. The system of claim 17, wherein the executing further comprises:
identifying a sufficient set of cutpoint signals that, if cutpoints are injected thereon, allow the selected unreachable cover to be reached; and
selecting a set of key cutpoint signals from the sufficient set of cutpoint signals as the root cause for the selected cover.

19. The system of claim 17, wherein the identifying further comprises:
selecting a current set of signals fanning into a given set of logical operators upstream from a logical operator for the selected cover; and
iteratively executing a search to determine the sufficient set of cutpoint signals, and each execution of the search that is iteratively executed to determine the sufficient set of cutpoint signals comprises:
injecting cutpoints on to the current set of signals to determine if the selected cover is reachable with the injected cutpoints onto the current set of signals;
determining whether the selected cover is reachable with the current set of signals with injected cutpoints;

choosing a prior set of signals as the sufficient set of cutpoint signals in response to determining that the selected cover is unreachable with the current set of signals with injected cutpoints; and changing the current set of signals to a next set of signals fanning into another set of logical operators upstream from the given set of logical operators in response to determining that the selected cover is reachable with the current set of signals with injected cutpoints.

20. The system of claim 19, wherein selecting the set of key cutpoint signals of the sufficient set of cutpoint signals further comprises:

applying cutpoints to a current set of signals of the sufficient set of signals;

iteratively executing a search to determine the set of key cutpoint signals from the sufficient set of cutpoint signals, and each execution of the search that is iteratively executed to determine the set of key cutpoint signals comprises:

removing the applied cutpoints to a selected subset of signals of the current set of signals;

determining whether the selected cover is reachable with a remaining subset of signals of the current set of signals;

changing the current set of signals to the remaining subset of signals in response to determining that the cover is reachable with cutpoints applied to the remaining subset of signals; and setting the key cutpoint signals to the selected subset of signals in response to determining that the selected cover is unreachable without applying cutpoints to the selected subset of signals.

* * * * *